US005777314A

United States Patent [19]

Roustaei

[11] Patent Number: 5,777,314
[45] Date of Patent: Jul. 7, 1998

[54] OPTICAL SCANNER WITH FIXED FOCUS OPTICS

[75] Inventor: Alexander Roustaei, San Marcos, Calif.

[73] Assignee: Symbol, Holtsville, N.Y.

[21] Appl. No.: 743,977

[22] Filed: Nov. 5, 1996

Related U.S. Application Data

[63] Continuation of Ser. No. 363,985, Dec. 27, 1994, abandoned, which is a continuation of Ser. No. 59,322, May 7, 1993, abandoned, which is a continuation-in-part of Ser. No. 965,991, Oct. 23, 1992, Pat. No. 5,354,977, which is a continuation-in-part of Ser. No. 956,646, Oct. 2, 1992, Pat. No. 5,349,172, which is a continuation-in-part of Ser. No. 843,266, Feb. 27, 1992, Pat. No. 5,291,009.

[51] Int. Cl.$^6$ ..................................................... G06K 7/10
[52] U.S. Cl. ............................................. 235/462; 235/472
[58] Field of Search ..................................... 235/462, 472, 235/454, 467

[56] References Cited

U.S. PATENT DOCUMENTS

| | | | |
|---|---|---|---|
| 4,136,821 | 1/1979 | Sugiura et al. | 235/462 |
| 4,560,862 | 12/1985 | Eastman et al. | 235/462 X |
| 4,570,057 | 2/1986 | Chadima, Jr. et al. | 235/472 |
| 4,734,566 | 3/1988 | Senda et al. | 235/454 |
| 4,743,773 | 5/1988 | Katana et al. | 235/472 |
| 4,818,847 | 4/1989 | Hara et al. | 235/472 |
| 4,900,907 | 2/1990 | Matusima et al. | 235/472 |
| 5,010,241 | 4/1991 | Butterworth | 235/462 |
| 5,073,954 | 12/1991 | Van Tyne et al. | 235/463 |
| 5,135,160 | 8/1992 | Tasaki | 235/462 |
| 5,192,856 | 3/1993 | Schaham | 235/462 |
| 5,196,684 | 3/1993 | Lum et al. | 235/462 |
| 5,291,009 | 3/1994 | Roustaei | 235/472 |
| 5,349,172 | 9/1994 | Roustaei | 235/472 |
| 5,354,977 | 10/1994 | Roustaei | 235/472 |

FOREIGN PATENT DOCUMENTS

| | | | |
|---|---|---|---|
| 34681 | 2/1986 | Japan | 235/462 |
| 289470 | 12/1986 | Japan | 235/462 |
| 152584 | 6/1989 | Japan | 235/462 |
| 224887 | 9/1989 | Japan | 235/462 |
| 4-69788 | 3/1992 | Japan | 235/472 |

OTHER PUBLICATIONS

Data Sheet: CCD Bar Code Scanner; ZB-1000/2000 Plus Series, Zebex Industries, Inc., 1992 Zebex Catalog No. 920802.
Data Sheet: CCD Bar Code Handy Scanner Model BHS-6000 Series; Nippondenso Co., Ltd., Mar. 1992.
Advertisement: "Get a Head with Denso's Reading Edge Technology". ID Systems, Apr. 1987, vol. 7, No. 3.
"Information Encoding with Two–Dimensional Bar Codes", Theo Pavlidis, et al., Computer, vol. 25, No. 6, Jun. 1992, pp. 18–28.

*Primary Examiner*—Donald T. Hajes
*Assistant Examiner*—Thien Minh Le
*Attorney, Agent, or Firm*—Brown, Martin, Haller & McClain

[57] ABSTRACT

Methods are provided to assist in selection of appropriate optical components for optimizing performance of the optical scanner for reading one-, two- and three-dimensional optically encoded information at a wide range of field depths and angles. The optical components are fixed in position relative to each other so that no position adjustments are required to obtain a reading at a desired distance once the optical components are optimized. Among the parameters that are considered are LEDs for emitting light within specific wavelength ranges, optical filters, lens focal lengths, magnification, etc. The Fourier transform of an input square wave signal generated by light reflected from a bar code is used to generate the appropriate resolution requirements. Selection of appropriate optical components is dependent upon the intended operation of the scanner. For example, depth of field is considered, as is scan angle and density of the code to be read. The performance models are based upon the modulation transfer function (MTF) of the optical system, comprising the encoded information, the lens system and the CCD array.

20 Claims, 12 Drawing Sheets

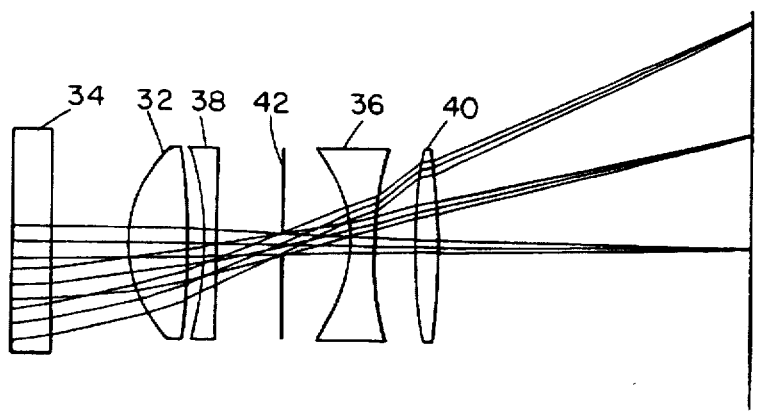
FIG. 26
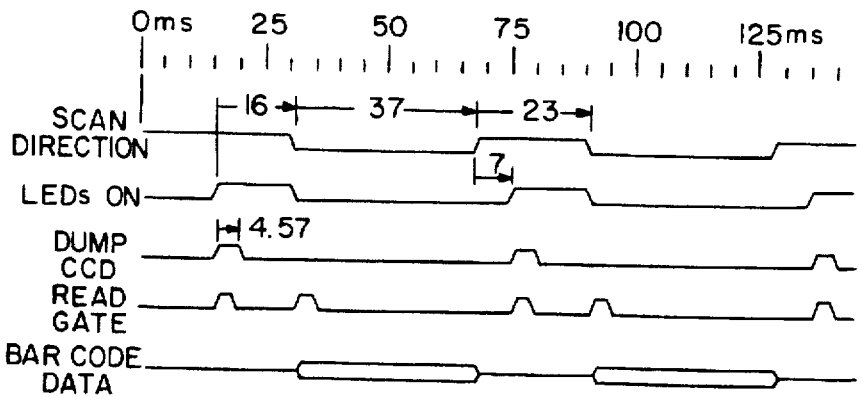
FIG. 29A SCAN DIRECTION
FIG. 29B LEDs ON
FIG. 29C DUMP CCD
FIG. 29D READ GATE
FIG. 29E BAR CODE DATA
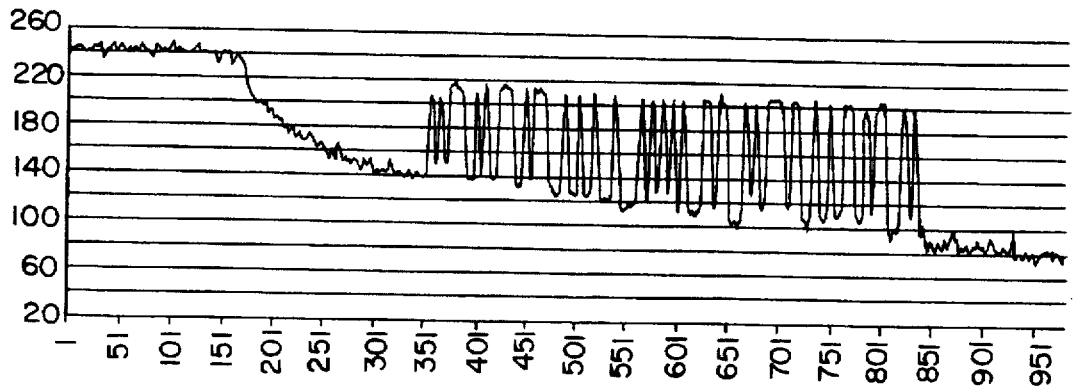
FIG. 30
FIG. 31

5,777,314

OPTICAL SCANNER WITH FIXED FOCUS OPTICS

This application is a continuation of application Ser. No. 08/363,985, filed Dec. 27, 1994, now abandoned, which is a continuation of Ser. No. 08/059,322, filed May 7, 1993, now abandoned, which is a continuation-in-part of application Ser. No. 07/965,991, filed Oct. 23, 1992, now issued as U.S. Pat. No. 5,354,977, which is a continuation-in-part of application Ser. No. 07/956,646, filed Oct. 2, 1992, now issued as U.S. Pat. No. 5,349,172, which is a continuation-in-part of application Ser. No. 07/843,266, filed Feb. 27, 1992, now issued as U.S. Pat. No. 5,291,009. This application is also related to application Ser. No. 08/307,911, filed Sep. 16, 1994, now issued as U.S. Pat. No. 5,532,467, which is a continuation of application Ser. No. 07/956,646, referenced previously.

FIELD OF THE INVENTION

The invention generally relates to a scanning system for reading and/or analyzing optically encoded symbols and more particularly, to a method for optimizing performance of a CCD bar code scanner.

BACKGROUND OF THE INVENTION

Many industries, including the assembly processing, grocery and food processing industries, utilize an identification system in which the products are marked with a bar code symbol consisting of a series of lines and spaces of varying widths, or other types of symbols consisting of series of contrasting markings. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner which can be incorporated into a portable system uses light emitting diodes (LED) as a light source and charge couple devices (CCD) as detectors. This class of bar code scanners is generally known as "CCD scanners". While CCD scanners have the advantage of being less expensive to manufacture, they limit the user to scanning the bar code by either contacting the surface on which the bar code is imprinted or maintaining a distance of no more than one and one-half inches away from the bar code, which creates a further limitation in that it cannot read a bar code any longer than the window or housing width of the scanning head. Thus, the CCD scanner does not provide the comfort or versatility of the laser scanner which permits variable distance scanning of bar code symbols which may be wider than the window or housing width.

Recently, considerable attention has been directed toward two-dimensional bar codes, which can store about 100 times more information in the same space occupied by a one-dimensional bar code. In two-dimensional bar coding, rows of lines and spaces are stacked upon each other. The codes are read by scanning a laser across each row in succession in a zig-zag pattern. This scanning technique introduces the risk of loss of vertical synchrony. It also has the disadvantage of requiring a laser for illumination of the bar code, which makes the scanner more expensive.

In co-pending application Ser. No. 08/058,951, the inventor discloses a system for three-dimensional optical encoding of information and an optical scanner for reading the three-dimensional code. In all types of optical codes, i.e., one-dimensional, two-dimensional and three-dimensional, the performance of the optical system should be optimized to provide the best possible resolution, signal-to-noise ratio, contrast and response. These and other parameters are controllable by adjustments to the optical components, e.g., lens system, wavelength of the illuminating light, and optical and electronic filtering.

SUMMARY OF THE INVENTION

It is an advantage of the present invention to provide a method for optimizing the optical system within an optical scanning head for reading optically-encoded information (code) at a range of distances and angles from the printed code using LED light sources and CCD detectors.

It is a further advantage of the present invention to provide a model for optimizing the critical parameters for reading optically encoded information in one-, two- or three-dimensions.

Still another advantage of the present invention is to provide a model for selecting features of an optical scanner to provide reliable performance over a range for use in variable conditions such as varied depths of field and scan angles.

Another advantage of the present invention is to provide a method for optimizing the depth of field of an optical scanner without requiring any moving parts within the optical train.

In an exemplary embodiment, the optical scanning head comprises a plurality of light emitting diodes arranged so they can be in close proximity to each other with each of the LEDs being oriented to emit light at different angles, or one LED on each side of the optical lens assembly, so that a fan of light is created. Generally, LEDs are also oriented so that all LEDs are directed at some non-zero angle from a line perpendicular to the window through which the light is emitted. The number of LEDs can be varied depending on the intensity of light desired and the application. For example, a scan of a two-dimensional bar code will require more LEDs, generally in a double light arrangement, while a one-dimensional bar code needs only one row. A single scanning head can be made with the ability to select one-or two-dimensional scanning by including a trigger or other switching means which activates the appropriate number of LEDs. The LEDs can be arranged in a number of different groupings, such as in a "V"- or "U"-shape, or in single or parallel lines. In an alternate embodiment, the LED array can be replaced with a flash lamp, which provides more intense light for scanning at greater distances.

An optical module includes a light shield or "dark room" and a lens/filter assembly which provides control of the depth of focus of the scanner. The optical module is located behind the light source, and the detector, made up of a CCD array is mounted behind the optic module for detecting the light intensity in the reflected beam over a field of view across a bar code symbol. The magnification of the lens/filter assembly is optimized to completely fill the CCD array, allowing a wide range of depth of field without requiring any moving parts within the assembly. The CCD array may consist of a single linear arrangement, a double linear arrangement, or a matrix arrangement. The CCD array generates an electrical signal indicative of the detected light intensity. This signal is conveyed to a signal converter consisting of an analog filter and analog-to-digital conversion circuitry to filter noise and digitize the analog signal to generate data descriptive of the bar code symbol. An automatic gain control, edge detection or highly-adaptive thresholding is provided to adjust the magnitude of the received signal to a pre-determined level, regardless of the distance between the bar code and the scanner and the ambient illumination. In an alternate embodiment, the output of the CCD array will be fed to the input of the A/D converter. The reference voltages in the A/D converter will be selected to maximize the full scale range of the A/D for the offset voltage from the CCD. The reference voltage $V_{REF}$ for the A/D may be programmable to maximize the sensitivity for low light level situations. The output of the A/D converter will be latched for reading by the microprocessor, so the output value may be read while the next conversion is in progress. Each of these techniques look, in effect, at the slope of the waveform produced when a bar code is scanned (while the ideal signal would be a set of rectangular pulses, the real signal has a rounded form because of the convolution distortion). However, using an appropriate optical model for selecting the optical system components, the effects of distortion of the square wave signal can be minimized.

A light transmissive window is positioned in front of the LEDs for manipulating and focussing the light. The window may include a filter and/or anti-reflection coating. The window may be configured to have a double radius for focussing at two different focal distances, and may be "knurled" or scalloped to homogenize the light. For optimum efficiency, the window is located at a distance in front of the LEDs coinciding with the greatest concentration of light.

The optical scanning head is powered by a D.C. source or battery, preferably rechargeable, which provides DC voltage to the LEDs and CCDs in response to a clocked signal which is provided by a drive clock sequencer and synchronization module. The timing signal can control a gradual, serial illumination of the LEDs and coordinates the activation of the CCDs in order to minimize power consumption during scans. Alternatively, the voltage supplied to the LEDs can be modulated in response to the level of the signal produced by the CCDs. If a bar code is scanned at close range, a lower level of light will provide a strong signal. However, at greater distances from the bar code, higher light intensity is necessary to achieve a good quality signal at the CCDs. Power is conserved in the latter version by not providing full power to the LEDs unless necessary.

The timing signal may also be used to control an optional electronic shutter which periodically closes to create "snapshots" of the bar code. This preserves the integrity of the bar code pattern signal while the scanner or the bar code is in motion.

Mathematical models are provided to assist in selection of appropriate optical components for optimizing performance of the optical scanner at a wide range of field depths and angles. The optical components are fixed in position relative to each other so that no position adjustments are required to obtain a reading at a desired distance once the optical components are optimized. Among the parameters that are considered are LEDs for emitting light within specific wavelength ranges, optical filters, lens focal lengths, magnification, etc. The Fourier transform of the input square wave signal is used to generate the appropriate resolution values. Selection of appropriate optical components is dependent upon the intended operation of the scanner. For example, depth of field is considered, as is scan angle and density of the code to be read. The mathematical models are based upon the modulation transfer function (MTF) of the optical system, calculation of which is generally known in the art.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 26 is an optical system ray trace;

FIGS. 29a through 29e are plots of the timing diagram configuration with respect to activation of the scanner, showing the scan direction (FIG. 29a); activation of the LEDs and the exposure time (FIG. 29b); dumping of the CCD (FIG. 29c); read gate time (FIG. 29d); and data (FIG. 29e);

FIG. 30 is a plot of the video output signal of the CCD; and

FIG. 31 is a plot of the microprocessor output signal.

DETAILED DESCRIPTION OF THE PREFERRED EMBODIMENT

Figure 1:
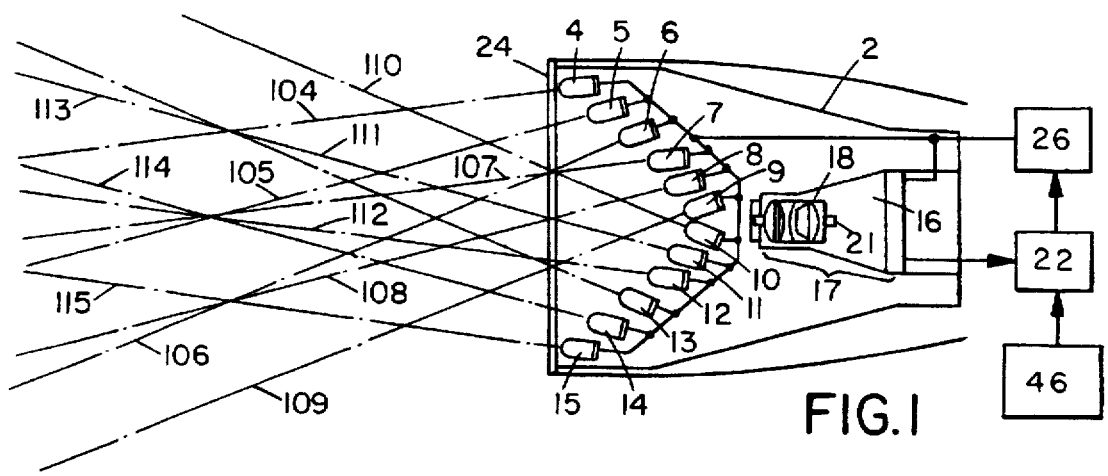
FIG. 1 is a diagrammatic view of the relative layout of the LEDs, optical module, and detector on a printed circuit board.

The scanning head module illustrated in FIG. 1 comprises the printed circuit board (PCB) 2 configured as a generally "U"- or "Y"-shaped surface onto which is mounted a plurality of LEDs (from 2 to 24 individual LEDs) configured in a "V"-shaped, "U"-shaped, or linear pattern in an orientation that results in projection of a light ray by one LED in a direction distinct from other LEDs in the group. The configuration illustrated in FIG. 1 has 12 LEDs mounted on the PCB 2 in a "V"-shape. These are identified as LEDs 4 through 15, which emanate rays of light 104 through 115. The portion of printed circuit board 2 from which LED light emanates will be considered the front of the board. A line of reference for describing the orientation angles of the LEDs runs perpendicular to the front of the PCB 2. At the approximate center of the board, behind the LEDs, an optical module 17 consisting of a light shield (dark room 16), in which is contained lens assembly 18 which filters and focuses light reflected from a scanned bar code onto CCD detector 20, is disposed behind the optical module at the rear of PCB 2. A signal generated by activation of the CCDs by the reflected light is conveyed to signal converter 22 which consists of an analog filter and an analog-to-digital circuit. Forward of the LEDs, either attached to the PCB 2 or mounted within a housing containing PCB 2, is window 24 which is light transmissive and provides filtering, focusing and positioning of the light path of the illuminating beam incident upon the bar code to be scanned. The reflected light carrying the intensity modulated bar code signal is directed back to the lens assembly and to the detector.

Figure 12A:
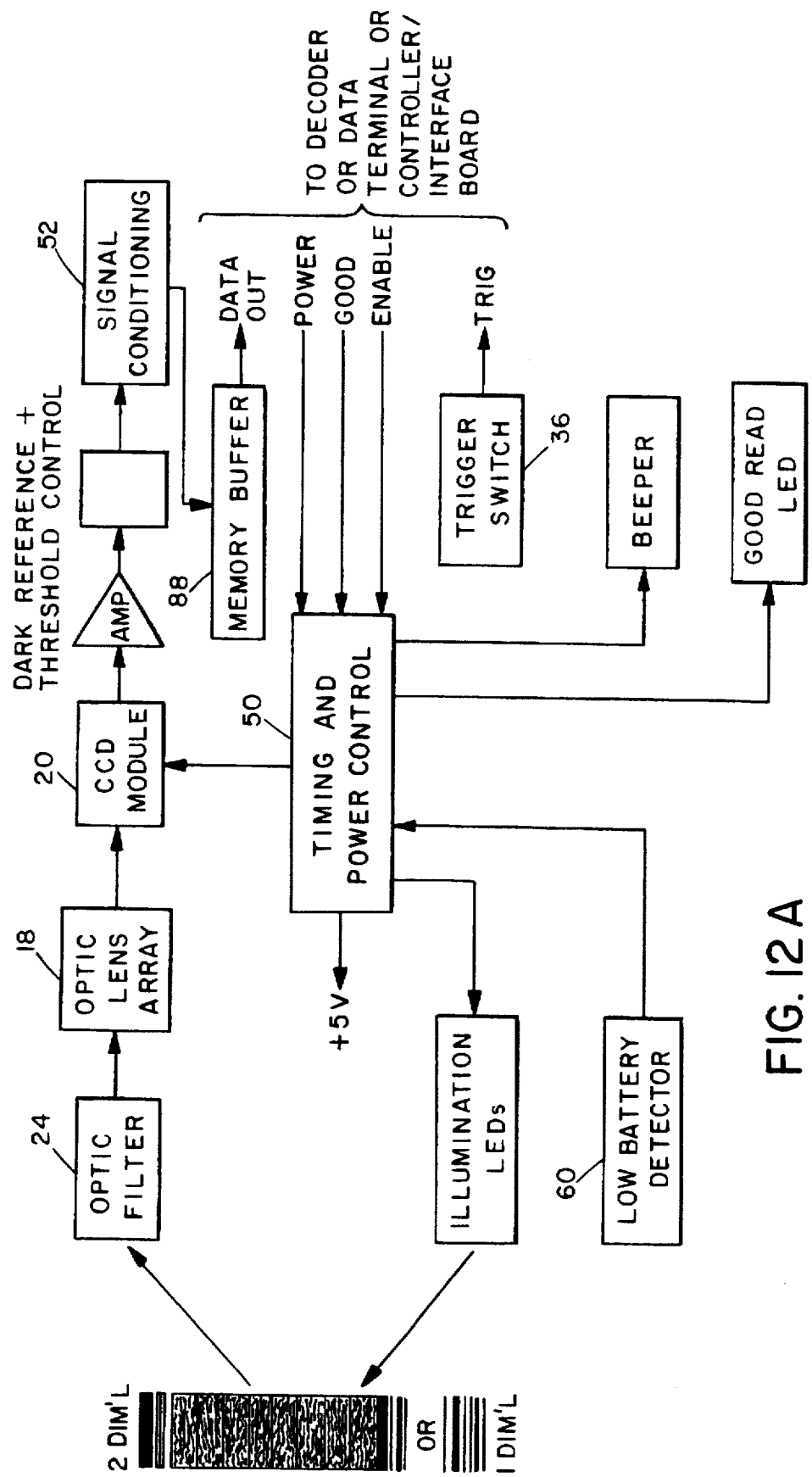
FIGS. 12a and 12b are alternate block diagrams of the scanning sequence.

The scanning head may also include a decoder module 26 which decodes a multiple-digit representation of bar code symbols such as UPC, EAN, JAN, Code 39, Code 2/5I, Code 2/5, Code 128, Codabar, Plessey, and other optical encoding systems. (It should be noted that, while most optical encoding techniques of this nature are generically called "bar codes", some types of printed codes exist which may not be in the form of parallel bars. For example, a concentric target-type code is in use which involves alternating concentric rings of varying widths. The code systems that incorporate non-bar-type codes are also appropriate for measurement by the optical scanning system described herein and are considered to be included in the general category of bar codes for purposes of this description.) In the two-dimensional bar code reader, a memory buffer 88, shown in FIG. 12a, will store the two-dimensional image prior to decoding by decoder module 26.

Figure 2A:
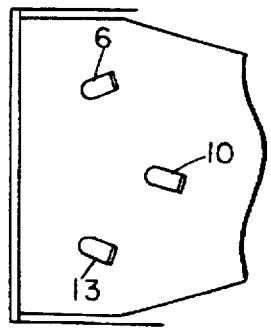
FIGS. 2a, 2b, 2c and 2d are diagrammatic views of relative locations of LEDs for one trio, two trios, three trios of LEDs, and a pair of LEDs, respectively.
Figure 2B:
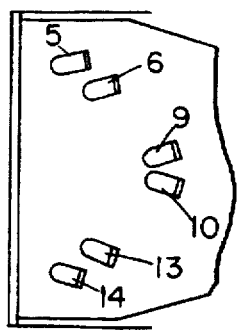
Figure 2C:
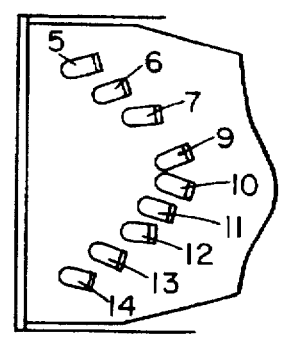

A first exemplary embodiment of the light source illustrated in FIG. 1 consists of 12 LEDs which are mounted in a generally V-shaped configuration relative to other LEDs so that they point outward at angles such that groupings of three on a single leg, e.g. LEDs 4, 5 and 6 or 13, 14 and 15 form substantially a single beam of light which expands at increased field depth. An example of the groupings of the LEDs are illustrated in FIGS. 2a, b and c. The 12 LEDs shown in FIG. 2c are divided into groups of three, or trios, of LEDs. From this it can be seen that a given trio of LEDs is not determined by serial progression of the LED's location in the V-configuration, but rather that the combined illumination of the trio substantially fills the window 24 and expands therefrom to form a fan of light to facilitate detection of bar codes which are wider than the window itself.

Figure 2D:
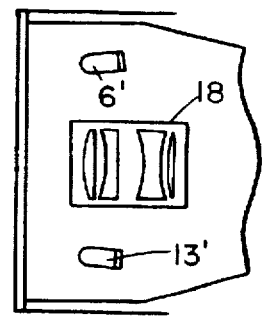
Figure 27:
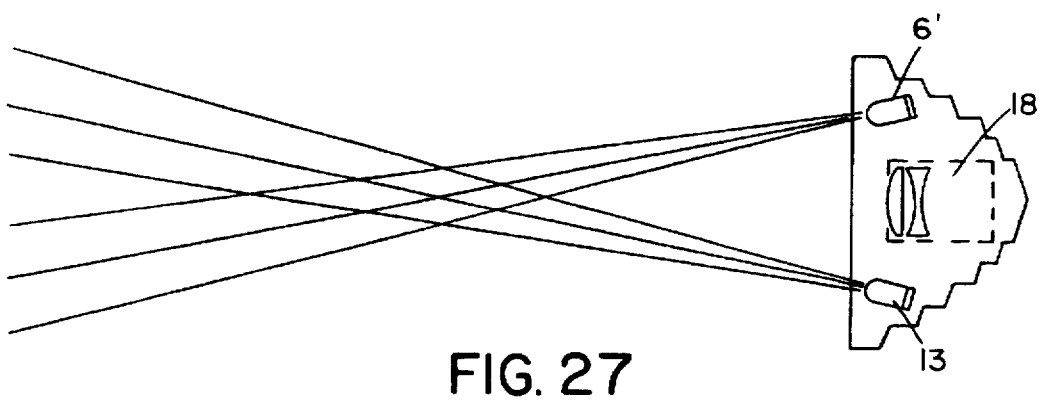
FIG. 27 is a fourth alternate LED layout and its corresponding light distribution.

As an alternative to the above LED distributions, FIG. 2d illustrates a configuration using only two LEDs 6' and 13', positioned on opposite sides of the optical assembly 18. The illumination pattern of this LED configuration is illustrated in FIG. 27.

Figure 11:
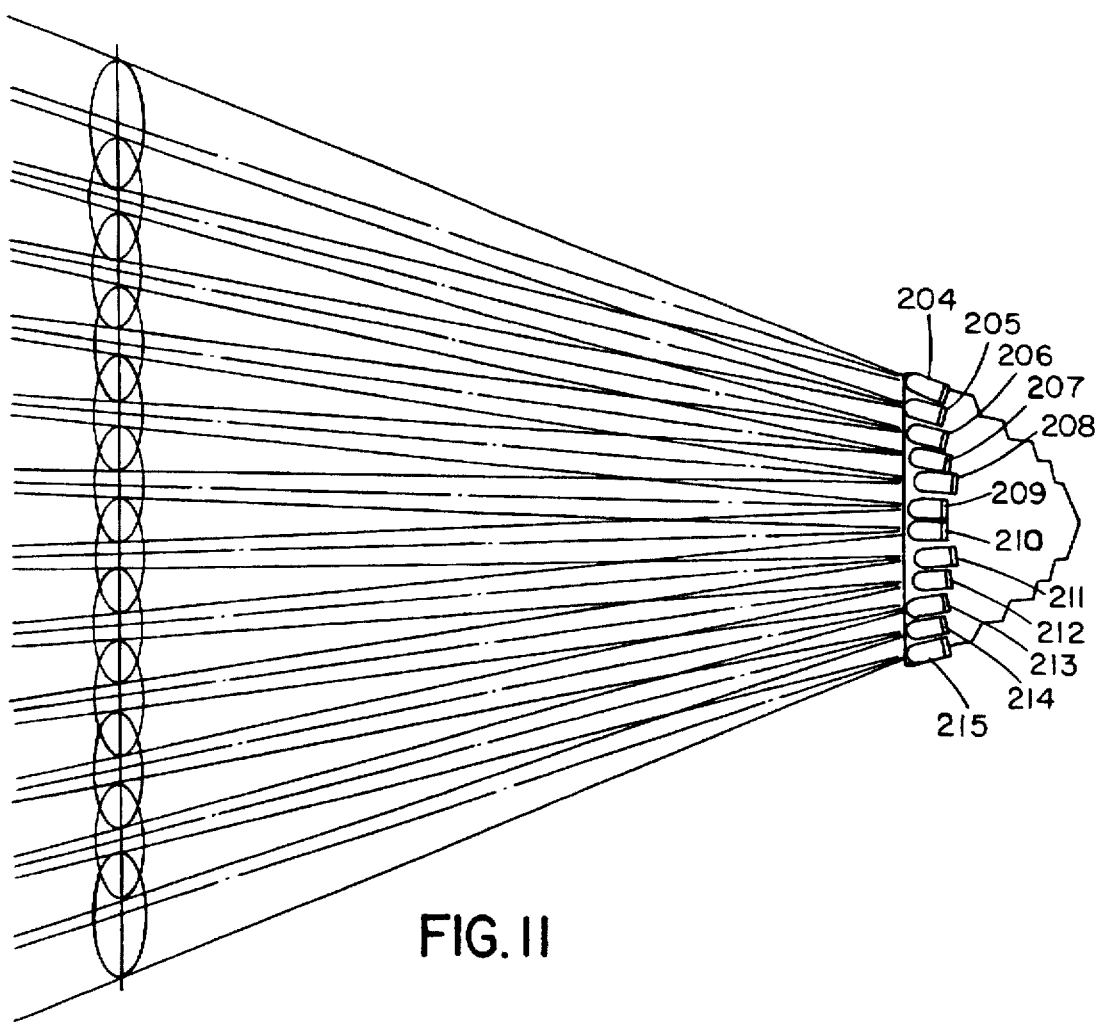
FIG. 11 is a diagrammatic view of a third alternate LED layout and its corresponding light distribution.
Figure 18A:
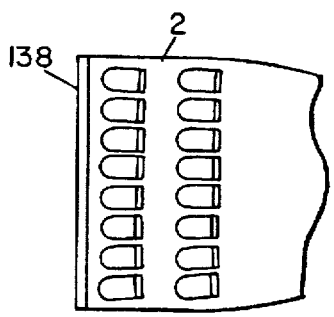
FIGS. 18a through 18f are diagrammatic views of LED orientation for two-dimensional scanning, parallel and perpendicular to the front of the printed circuit board, respectively.
Figure 18B:
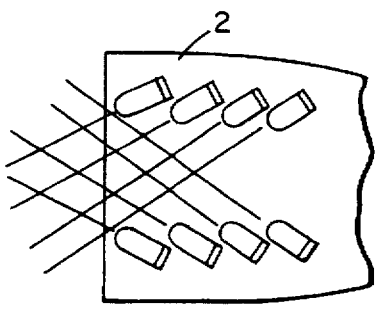
Figure 18C:
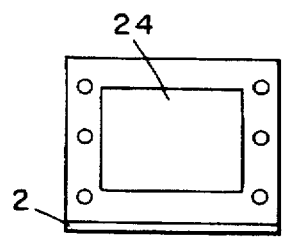
Figure 18E:
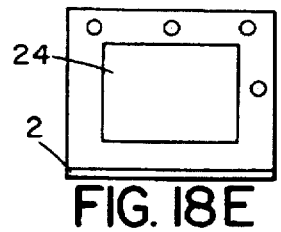
Figure 18D:
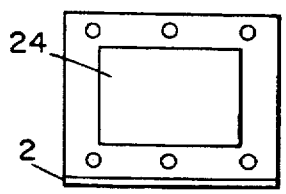
Figure 18F:
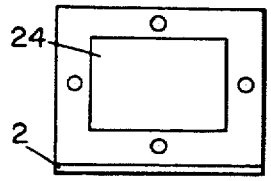

Other alternate configurations for arrangement of the LEDs can be a "U"-shape or generally straight line across the front of the board, as illustrated in FIG. 11. For two-dimensional bar code scanning, the variations can include two linear rows of LEDs, parallel to the front of the PCB 2, or two linear rows of LEDs perpendicular to the front of the board, as illustrated in FIGS. 18a and 18b, respectively. Combinations of parallel and perpendicular rows may also be used. A multi-tiered arrangement can be used for positioning the LEDs, with, for example, one row above the other, as in FIG. 18d, or with two vertical rows extending upward from PCB 2, as in FIG. 18c, or any combination thereof. In FIG. 18e, a possible combination consists of one row of LEDs running across the upper row, and a single LED on one side, and in FIG. 18f, a single LED is located on each of four sides in a vertical plane. In each case, the fan of light is created by orienting the LEDs at different angles. In the straight line configuration of FIG. 11, the centermost LEDs 209 and 210 are turned to point away at an angle of 1.625 degrees from a line normal to the front of the board. Progressing outward, each LED is 3.25 degrees from the inner adjacent LED.

The LEDs for one- and two-dimensional scanners are selected so that they emit light at the wavelength of approximately 660 nm, red light within the visible spectrum. This wavelength provides optimal contrast for bar code scanning applications in which dark and light bars must be distinguished. (For three-dimensional bar codes, two or more distinct wavelengths of light are selected, one of which may be 660 nm.) Infrared light also provides enhanced contrast, so that LEDs emitting light outside of the visible spectrum may be used. LEDs of differing colors may also be used. The optimum scanning wavelength is determined by measuring several color and black and white codes of various types using a photometer. The incoherent light produced by the LEDs may be replaced by coherent light from by laser diodes, helium-neon lasers or other coherent light sources as long as the appropriate mechanical means, such as a rotating reflective surface, are provided to spread or scan the spot to generate the light.

Figure 28:
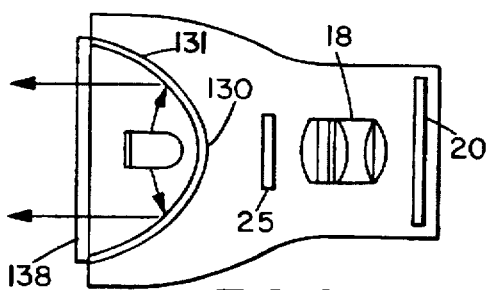
FIG. 28 is a diagrammatic view of a single light source with a parabolic reflector.

An alternate light source is a flash lamp 130, or any other intense light source, illustrated in FIG. 28. Flash lamps are available to emit light at a number of different wavelengths. The wavelength at which the selected flash lamp emits light will be determined by the color of the bar code(s) and the background, so that the best possible contrast is obtained. A parabolic reflector 132 is included within the optical scanning head assembly with the flash lamp 130 at its center. This allows the maximum amount of light to be directed forward for illumination of the bar code. The higher intensity light will permit scanning at distances greater than 35 inches.

A sample test for bar code contrast measurement involves placing the targets in uniform illumination (from a standard white light source) and measuring the photopic reflectance with the meter. The following references were measured:

TABLE 1

| Target | Reflectance (cd/m$^2$) |
| --- | --- |
| Standard white card | 330 |
| Standard black card | 14.0 |
| White bar | 300 |
| Black bar | 22.0 |
| Red bar | 97.0 |
| Blue bar | 114.0 |
| Green bar | 140.0 |

Figure 3:
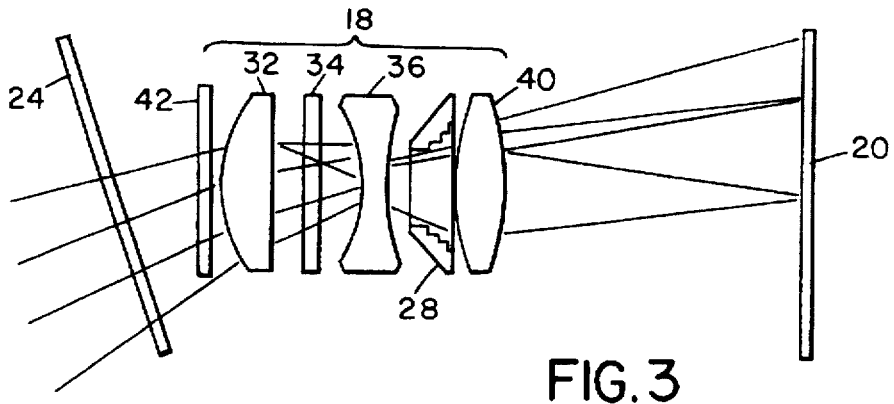
FIG. 3 is an exploded view of an exemplary embodiment of the lens assembly.
Figure 4:
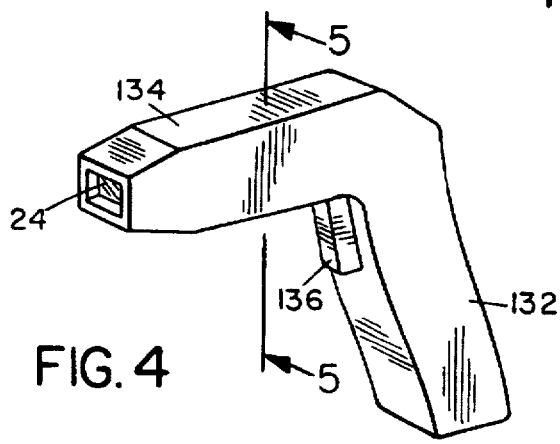
FIG. 4 is a perspective view of an assembled optical scanning head including a housing.

Another consideration in selection of LEDs is based upon the detectors to be used. The selection of the operational wavelength of an LED with a particular type of CCD is determined by two parameters: first, the spectral responsivity of the CCD in volts/lumen (V/L) or volts/watt (V/W) and, second, the total luminous flux output F in lumens (L) of the LED. The evaluation to determine the relative figure of merit between any combination of LEDs and CCDs is given by the following equation:

$$V_{out} = \int V(\lambda) F(\lambda) d(\lambda) \quad (1)$$

where $V(\lambda)$ is the CCD spectral sensitivity in volts/lumen/micron and $F(\lambda)$ is the flux output in lumens/micron of the LED. The normalized relative spectral sensitivity is given in FIG. 4-3 of the Sony data sheet for the ILX503. The flux output F is given by the maximum luminous intensity $I_v$ (lumens/steradian) times a constant determined by the radiation pattern of the LED. The constant is the integration of the relative luminous intensity as a function of angular displacement. This constant of integration is provided in the Hewlett-Packard data book (in FIGS. 7 and 8) and is labeled as $\phi_v(\theta)/I_v(0)$. The following LEDs were evaluated to determine the highest relative output voltage:

TABLE 2

| LED | $\lambda_{pk}$ (nm) | $V(\lambda)$ | $I_v$ (l/sr) | $\phi_v (\theta)/I_v (0)$ | $V_{out}$ |
| --- | --- | --- | --- | --- | --- |
| HLMA-CL00 | 590 | 0.9 | 1.3 | 0.180 | .22 |
| HLMP-8104 | 650 | 0.7 | 4.0 | 0.115 | .32 |
| HLMP-8100 | 650 | 0.7 | 0.7 | 0.290 | .14 |
| HLMP-8150 | 650 | 0.7 | 15.0 | 0.016 | .17 |

(* Since the CCD is optically filtered, the expression for $V_{out}$ can be approximated by a delta function.) For the purposes of the present invention, the HLMP-8104 was found to be the most efficient, offering 1.5 times the output of the next lower LED at 650 nm.

Several radiometric measurements were made on the HP-8103 5 mm LED to make observations on the coupling efficiency of this LED with several off-the-shelf lenses. The LED was biased to 20 mA and the following was recorded:

TABLE 3

| Distance (inches) | Lens | Reading in eV | |
| --- | --- | --- | --- |
| | | Center | Line |
| 1.0 | no lens | 10.0 | — |
| 16.0 | no lens | 8.0 | — |
| 7.0 | 1 cylindrical | 8.5 | 5.0 |
| 1.0 | 1 cylindrical | 10.0 | 6.5 |
| 6.0 | 1 collection/ cylindrical | 6.2 | 6.0 |

The cylindrical lens used is a Melles Griot 19.0 mm focal length and the collection lens is a plano-convex Germanon-Simon 15.3 mm focal length. The conversion from eV to luminance is given in Table 4 for the Minolta photometer. The units are candel/m$^2$ which is equivalent to lumens/sr-m$^2$. From these measurements, it would be reasonable to assume a luminance of 10.0 cd/M$^2$ for distances of 7" or less.

TABLE 4

| eV | cd/m$^2$ |
| --- | --- |
| 1 | 0.28 |
| 2 | 0.56 |
| 3 | 1.10 |
| 4 | 2.20 |
| 5 | 4.5 |
| 6 | 9.0 |
| 7 | 18.0 |
| 8 | 36.0 |
| 9 | 72.0 |
| 10 | 144.0 |

The objective of the optical system design is to achieve sufficient resolution on the object distance within the depth of field. These parameters may be obtained with a number of different lens combinations ranging from three to five or more lenses. After computer simulation of ray traces, a combination of four lenses was selected to provide the desired performance. In the preferred embodiment, the overall optical system specification calls for an object distance of 175 mm, a nominal magnification of 0.32, a nominal f/number of 26.0, effective focal length of 36.52 mm, total field of 26.5 degrees, track length of 19.49 mm and overall length of 46.89 mm. The MTF at best focus is >0.5 at 25 lines/mm.

The optic module 17 consists of four lenses mounted inside a slidable lens support 21, all of which are retained within dark room 16. The selection of the four lenses of which the lens assembly 18 is formed depends upon the desired reference plane, i.e., the desired depth of field, which is the distance between the front window or diffuser and the bar code being scanned. The lens assembly, illustrated in the ray trace in FIG. 26, consists of a bi-convex lens 32 and plano-concave lens 38, a bi-concave lens 36 followed by a bi-convex lens 40. The lenses may be coated with an anti-reflection coating and/or a pass-band coating to minimize reflectance at the interfaces between the adjacent lenses and at the ends of the lens assembly.

Table 5 lists the individual specifications that were identified for each lens in the preferred embodiment.

TABLE 5

| Lens | Focal Length | Total Track |
| --- | --- | --- |
| 32 | 14.20 mm | 3.63 ± .03 mm |
| 38 | −32.11 mm | .60 ± .03 mm |
| 36 | −12.86 mm | 1.66 ± .03 mm |
| 40 | 35.18 mm | 1.41 ± .03 mm |

All lenses are made from BSC7 with a refractive index of 1.514 at 660 nm, have an aperture stop diameter of 1±1 mm with a tolerance of ±0.05 mm and have a single layer anti-reflective coating at 660 nm. The values will vary if different combinations of lenses and/or material are to be used, and the above specifications are provided as an example of one way of achieving the desired optical performance. Selection of appropriate lens combinations is within the level of skill in the art so long as the guidelines provided herein are followed. The following descriptions of the plots provided in the drawings are intended to emphasize the numerous considerations in selecting the appropriate optical system.

FIGS. 20 through 25 provide plots which assist in selection of appropriate lens combinations. FIG. 20a, a plot of field curvature/distortion, illustrates the position away from the plane of the CCD of best focus for all field angles expressed as distance in millimeters. For example, for a field angle of ±13° off-axis, the position of best focus is 2.00 mm behind the CCD array. For all other angles, the plane of best focus corresponds very closely to the CCD location.

Figure 20A:
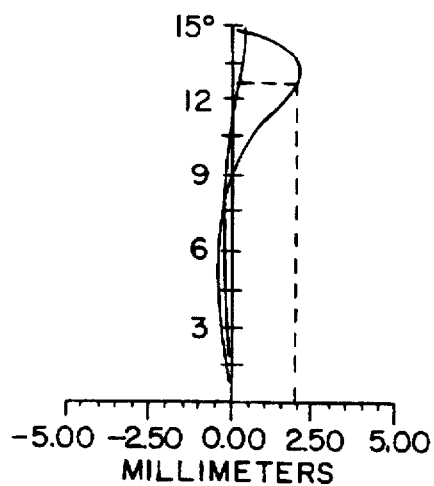
FIG. 20a is a plot of field curvature with field angle and FIG. 20b is a plot of percentage distortion with field angle.
Figure 20B:
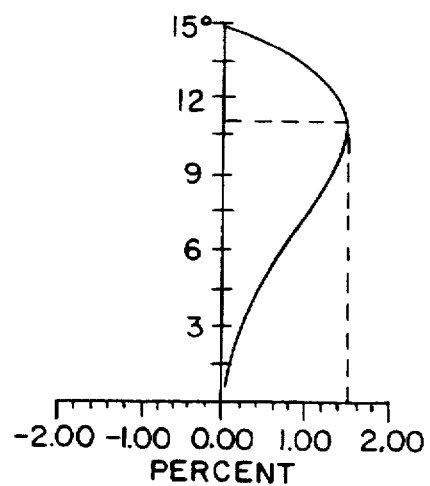

FIG. 20b plots percentage compression or expansion with field angle and provides the amount of compression or expansion of a bar width at the image plane in comparison with the true bar width expressed as a percentage. For example, if the true bar width on-axis is 6 mils wide, then at 11° off-axis, the bar width is 1.5% greater than 6 mil.

Figure 21:
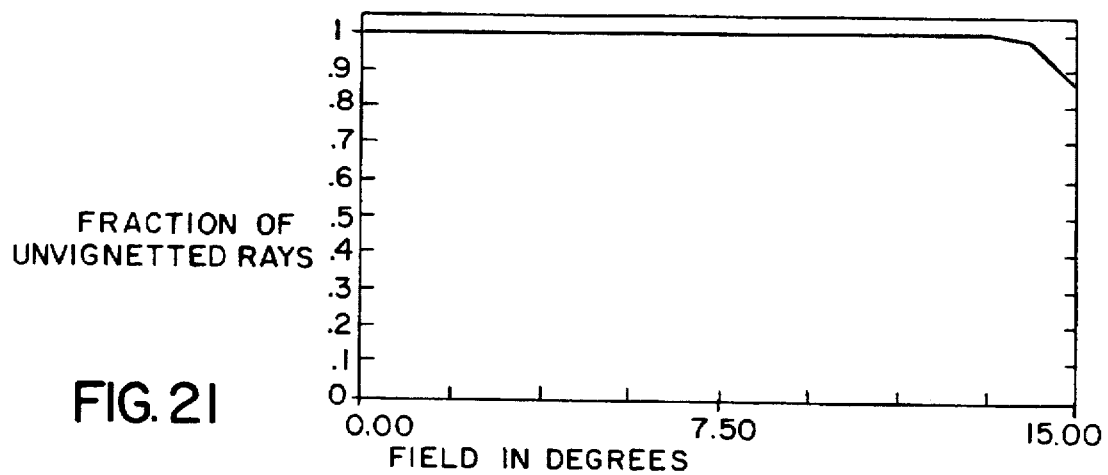
FIG. 21 is a plot of illumination uniformity as a function of field angle at the CCD.

Illumination uniformity as a function of field angle is charted in FIG. 21. The field angle values given in the plot are positive or negative angles with respect to "on-axis", so that the total field of view would be twice that value plotted, e.g., for 15°, the total field of view is 30°. The loss of illumination at increased field angle is due to aperture blockage or lens constraints.

Figure 22:
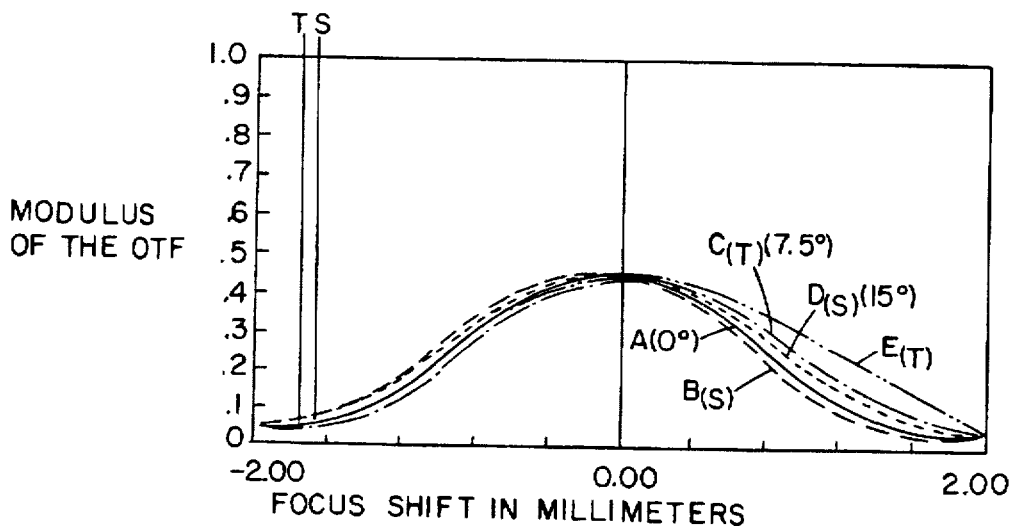
FIG. 22 is a plot showing contrast reduction with depth of focus for various field angles.

FIG. 22 is a plot of the diffraction through focus modulation transfer function (MTF). Five separate lines are drawn to indicate variation with field angle. Curve A shows the contrast reduction as the object is held at best focus while the image plane is moved in and out of focus for a field angle of 0°. (The x-axis of the plot is focus shift in millimeters.) For example, for a 30 line/mm resolution bar target, the contrast goes to zero when the image plane is moved in or out by more than 2.00 mm. Curves B and C are for a field angle of ±7.5° off-axis. Curve B is for sagittal rays and curve C is for tangential rays. Tangential rays only are images for the one-dimensional scanner, while two-dimensional scanner images use tangential and sagittal rays. Curves D and E are similar to curves B and C, respectively, but are for a field angle of ±15° off-axis.

Figure 23:
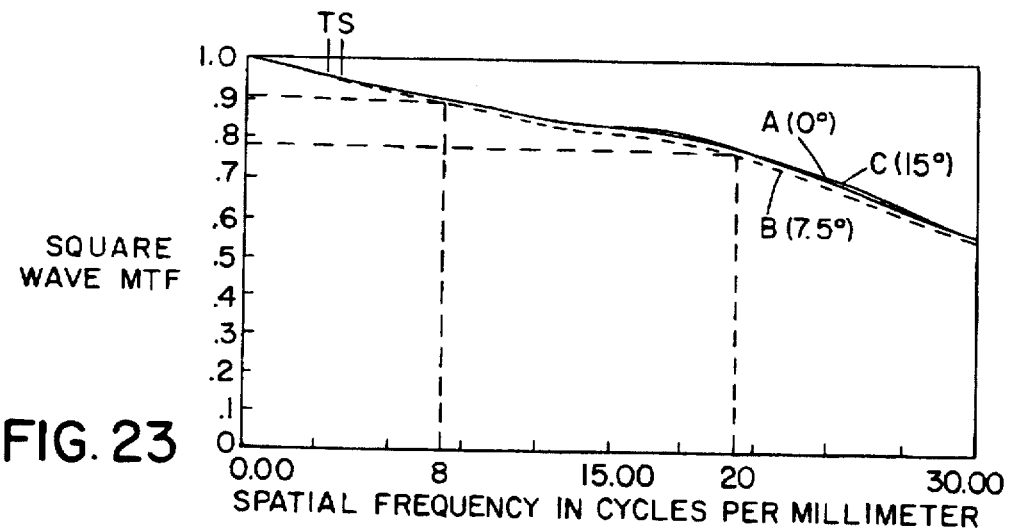
FIG. 23 is a plot showing contrast for all spatial frequencies at a distance of 5.5" from the scanning head.

FIG. 23 is a plot of diffraction square wave MTF with spatial frequency of the symbols (bar codes, etc.) to be read. Curve A provides the contrast of the optical system for all spatial frequencies at a distance of 5.5" for objects on-axis (0°). The plot is the same for tangential and sagittal rays for the on-axis case only for rotationally symmetric systems. Curve B is for a field angle of ±7.5° and curve C is for a field angle of ±15°.

Figure 24:
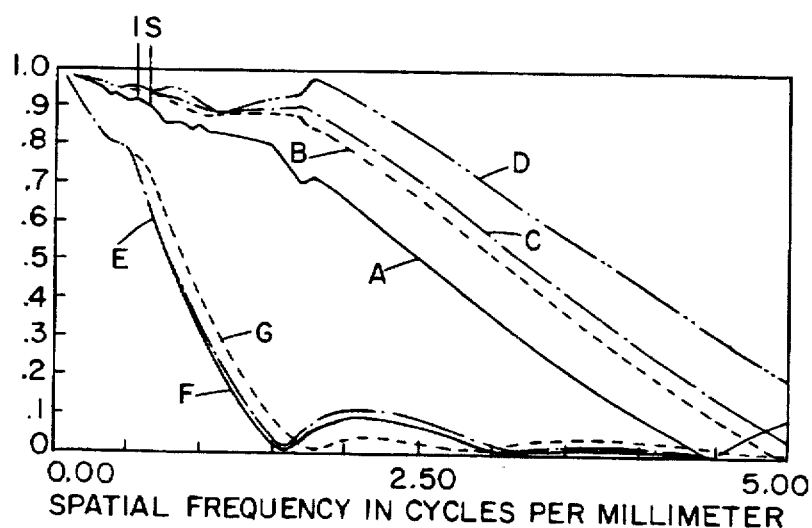
FIG. 24 is a plot showing resolution at various field angles at a given distance from the scanning head.

FIG. 24 is a plot of diffraction square wave MTF with spatial frequency of the symbol. Curve A is resolution with the scanner 20" from the symbol, on-axis (0°). Curves B,C and D are for on-axis, ±7.5° and ±15°, respectively at a distance of 16 inches from the code. Curves E, F and G are for on-axis (0°), ±7.5° and ±15°, respectively at a distance of 0.5" from the code which is being scanned.

Figure 25:
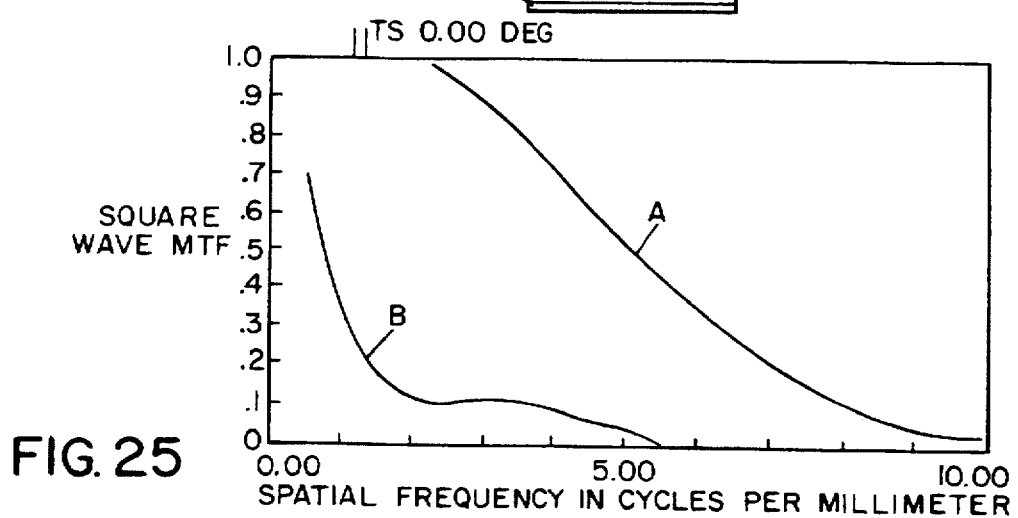
FIG. 25 is a plot of resolution at given distances from the scanning head.

FIG. 25 is a plot of resolution on-axis at 8.5" and 2" from the symbol, respectively.

Figure 13A:
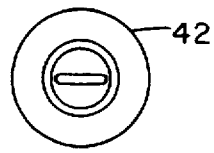
FIGS. 13a, 13b and 13c are front views of air slits/apertures for one-dimensional, two-dimensional, and/or three-dimensional applications, respectively.
Figure 13B:
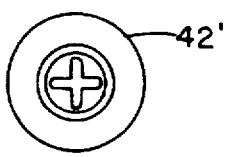
Figure 13C:
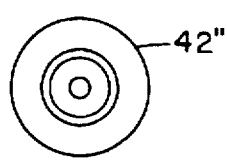

A spatial filter or aperture may be included within the optical module, disposed adjacent to or even integral with the lens assembly 18. The spatial filter 42 is an air slit with an orientation and configuration corresponding to the shape of the bar code being scanned, or can be a circular aperture 42" as illustrated in FIG. 13c. For a one-dimensional bar code, a single slit, illustrated in FIG. 13a, is used. The slit is oriented vertically so that it is perpendicular to the direction in which the bar code is scanned. For two-dimensional bar codes, a crossed slit pattern 42' is used, as shown in FIG. 13b. The horizontal and vertical slits may each have the same dimensions as the single slit, or the dimensions of the vertical and horizontal slits may differ from each other. Alternately for the two-dimensional and for the three-dimensional scanner, a single circular aperture 42" may be used. The light absorber/diffuser 28 is in the form of a funnel having an aperture with its wider end facing towards the detector end of the lens assembly. The funnel absorbs extraneous scattered and diffracted light which is not part of the signal. The bandpass filter 34 serves to block any radiation which falls outside of a wavelength range centered around 660 nm (or wavelengths surrounding infrared light for the infrared scanner). For the visible light system, it is particularly desirable to filter the infrared and other visible portions of the light spectrum which may reach the window from the sensing region to provide optimal contrast. This improves resolution of bar codes read at a distances other than the best focus object distance of 5.5 inches. In the preferred embodiment, the filter specifications call for a center wavelength of 655 nm±6 nm, half bandwidth points (HBWP) of 50 nm±5 nm, average transmittance (HBWP) >70%, leakage of less than 2% below 600 nm and above 700 nm, and coverage to 1 mm from all edges. The substrate material can include BK7, fused silica, quartz or Corning 7059.

The window 24 consists of a bandpass filter centered at approximately 660 nm (for the visible light scanner) and a light homogenizer/diffuser, and may be combined with, or separate from, a cylindrical lens 138, which focuses the light along one axis to form a plane of light, with a line of light being created at its focal point. When the bar code is scanned at the precise focal point of the cylindrical lens 138, the maximum possible light will be reflected to the detector. The window's function is to suppress radiation noise from the LEDs, to form a homogeneous incident beam for illumination of the bar code, to collimate the beam, and to filter the reflected light by removing extraneous light which falls outside of the predetermined acceptable bandwidth range of 660 nm.

The cylindrical lens 138 may be modified to provide a uniform distribution of light at the focal point. This "homogenization" is provided by knurling or scalloping the input side 90 of the lens, as shown in FIG. 14. Each step 92 in the knurled edge 90 acts as a "mini-lens" which spreads the light entering the cylindrical lens at that point. The spread light from each mini-lens overlaps other spread light to homogenize the light at the focal point of the cylindrical lens. The focal point of the cylindrical lens is determined by the outer side 94.

In conjunction with the knurled input edge, the output edge of the cylindrical lens can be either concave or convex.

Figure 14A:
FIGS. 14a and 14b are diagrammatic views of a knurled cylindrical lens with a concave and convex output edge, respectively.
Figure 14B:

The concave edge 94' is shown in FIG. 14a, and the convex edge 94 is shown in FIG. 14b. The concave edge 94' is selected for scans of two-dimensional bar codes at distances from contact to 3 inches. The convex edge 94 is used for scan distances greater than 3 inches.

Figure 15:
FIG. 15 is a diagrammatic view of a double radius cylindrical lens.
Figure 17:
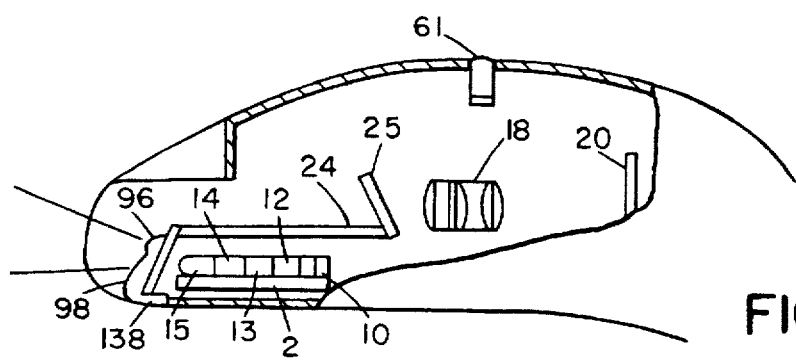
FIG. 17 is a side elevation, partially cut away, of the invention utilizing the double radius cylindrical lens.

Another modification of the cylindrical lens is illustrated in FIG. 15. The double radius creates, in effect, two separate cylindrical sub-lenses 96 and 98, each with a different focal length. The light emitted by the LEDs will be focussed by both sub-lenses 96 and 98 so that two different lines of focussed light are created at different angles from the lens, as shown in FIG. 17. This lens provides greater variability in the distance at which a bar code can be accurately read without requiring a change in the cylindrical lens or a compromise in the strength of the signal.

Figure 16:
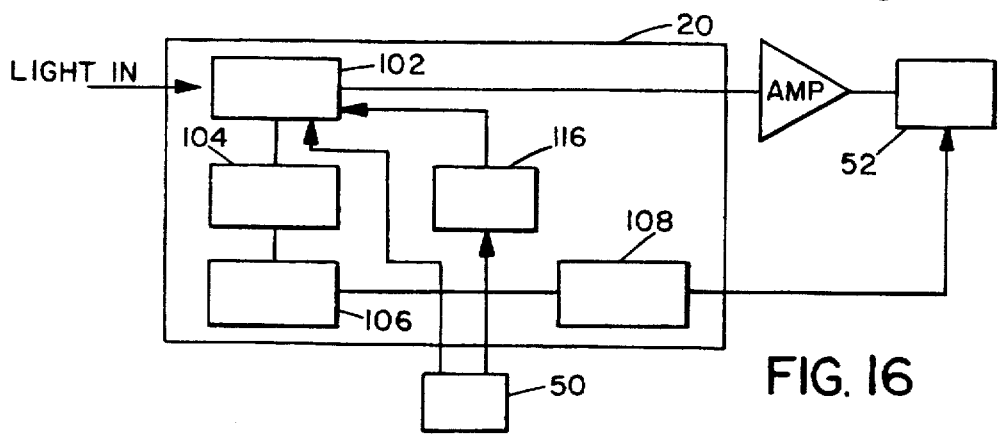
FIG. 16 is a block diagram of the CCD module.

The detector 20 consists of an array of charged coupled devices (CCD) which are arranged in equally spaced pixels, and may include additional processing elements which are shown in FIG. 16. The spacing of the pixels determines the limit of the resolution of the detector, so it is necessary to match the CCD resolution to the required spatial resolution in the image plane in which the detector lies. The magnification of the lens system is selected so that the received reflected light fills the detector array and so that at least 2 CCD pixels cover the minimum bar width to be resolved in the image plane. This is especially important for bar codes printed with a dot matrix printer.

The arrangement of the CCD array will depend on the application. For a one-dimensional bar code, a single linear array of CCDs is acceptable. For two-dimensional bar codes, a single linear array can be used by moving the scanning head from the top to the bottom of the bar code. However, to provide better resolution, two parallel lines of CCDs or a full area array of CCDs can be used. The use of multiple rows of CCDs permits use of an auto-correction technique in which the signal read by one row of CCDs can be double-checked by a second row.

Portions of the double line CCD array or the area array can selectively turned on and off by connecting the CCD module controller to an external trigger or switch which has multiple selections. This will allow a one-dimensional bar code to be read by a two-dimensional scanner, while conserving power by using only as much of the CCD array as needed.

Three types of CCDs, which are known in the art, may be used for the area array of the two-dimensional bar code reader. The first type is the full frame CCD which has a single parallel register for photon exposure, charge integration and charge transport. A shutter is used to control the exposure and to block light from striking the CCD during readout.

The second type, the frame transfer CCD, has a parallel register which is composed of two CCDs that are arranged in tandem. One of these CCD registers is the storage array which is covered with an opaque mask and provides temporary storage for collected charge during readout. The other CCD register, the image array, is identical in capacity to the storage array and is used to collect the image. After the image array is exposed, the electronic image it generates is shifted into the storage array for readout. While the storage array is read, the image array can collect charge for the next image.

The third type of CCD is the interline transfer CCD. This CCD has a parallel register that is subdivided so that the opaque storage register lies between the columns of pixels. The electronic image accumulates in the exposed area of the parallel register. For readout, the entire image is shifted under the interline mask. The CCD shift register also lies below the interline masks. The readout occurs the same as in the frame transfer CCD.

The area array 102, which is included in the CCD module 20 illustrated in FIG. 16, operates in an interlaced mode. This mode consists of shifting the potential wells by one-half pixel in alternate fields, "fields" referring to the field of view of the scanning head. This shift is possible due to the multiple phase arrangement of gate structures in the CCD which allows sequential propagation of the collected charges in the potential wells, as is known in the art. This results in two successive fields containing different information, given a certain number of line images with reduced aliasing. During the exposure or integration period, charge is accumulated on each pixel in proportion to the incident illumination. Every line includes a certain number of pixels. A transfer pulse will "readout" the charge on each line to generate an analog signal. The combined readouts of each line represent the two-dimensional bar code. The information will be conditioned and stored in memory buffer 88 in order to be decoded by decoder 26. After the transfer has occurred, the area array 102 will return to its integration state to accumulate charge for the next field.

In order to obtain the optimum performance, a calibration of the dark levels and shading correction must be made. A dark frame is stored and subtracted from an image to yield a zero reference.

A shading correction frame, or flat field, is required to make correction for variations in system responsivity. Because the CCD has excellent linearity, only one flat field must be taken to correct an image anywhere within the available dynamic range at a specific wavelength (660 nm). Shading varies with wavelength, and flat fields are often obtained at many wavelengths. A calibration sequence requires taking the image of interest $I_R$, a dark frame, $I_D$, and a flat field, $I_F$. An arithmetic pixel-by-pixel computation yields a corrected image with photometric integrity $$I_C = (I_R - I_D)/(I_F - I_D). \tag{2}$$

Selection of the CCD array is also influenced by the signal-to-noise ratio of a given device. In the preferred embodiment, a Sony ILX505 is used. The system parameters using the ILX505 are:

CCD sensitivity S: 21 V/lx-s at 3200K light source;

CCD relative spectral response: 1.0 at 475 nm, 0.65 at 650 nm;

Read out rate t: 36 frames/sec or integration time of 27.7 msec;

Dark voltage: 0.3 mV;

LED area $A_{LED}$: $2 \times 10^{-5}$ m$^2$;

LED intensity I: 4000 mcd at 650 nm;

LED solid angle illumination ω: 8.0 deg or 0.015 steradians;

Diffuser transmittance $T_D$: 0.9

Diffuser area $A_D$: $1.5 \times 10^{-4}$ m$^2$;

Bar code reflectance $R_B$: 0.50;

Total Optical System Transmission (at 650 nm) $T_O$=0.70;

Optical system f/number: 22.0.

The applicable conversions are:

The CCD sensitivity at 650 nm is 21 V/lx-s×0.65 =13.65 V/lm/m$^2$/s;

the total intensity I of the LEDs is 8.0 lumens/sr for two LEDs only.

The total brightness onto the diffuser is:

$$B = (I \omega/\pi A_{LED}) \tag{3}$$
$$= (8.0)(.015)/\pi(2 \times 10^{-5})$$
$$= 1,905 \text{ lumens/m}^2 - sr.$$

The total lumination onto the bar code is given by:

$$L = T_D B A_D/R^2 \tag{4}$$
$$= (.9)(1905)(1.5 \times 10^{-4})/(.177)^2$$
$$= 8.21 \text{ lumens/m}^2 - sr,$$

where R is the distance from the diffuser to the bar code.

The luminance L is, therefore, about 8.2 lumens/m$^2$-sr at a distance of 7 inches away.

When the optical system images the bar code onto the CCD, the final illuminance is given by:

$$E_{CCD} = \frac{\pi L T_o}{4 \, (f/no.)^2 (1+m)^2}, \tag{5}$$

where m is the system magnification. The illumination at the CCD is about 6.0E-3 lumens/m$^2$ for a magnification of 0.3.

Figure 19:
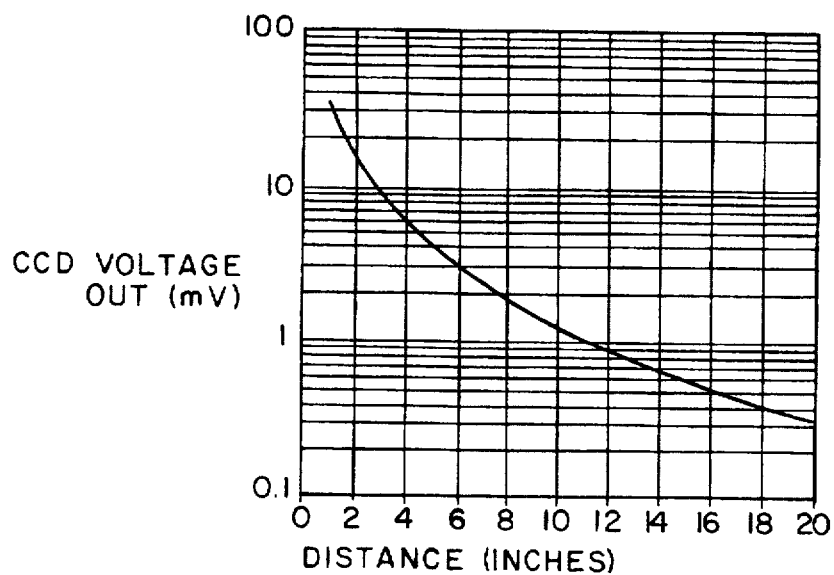
FIG. 19 is a plot of output signal voltage versus scanner distance from bar code.

The CCD converts the illumination into a voltage signal given by the following equation:

$$V_{out} = E_{CCD} S \, t, \tag{6}$$

where S is the sensitivity and t is the integration time. The result above indicates a signal of about 2.0 mV and, therefore, a SNR of 6.67 for a readout rate of 36 frames (scans) per second. A plot of voltage output of the CCD with distance of the scan is provided in FIG. 19.

The end-to-end simulation of an imaging CCD array reading a high spatial resolution target can be simulated by treating the individual system components as a Fourier transform operator on the input optical signal. The four main components are the input bar code, the optical lens, the readout decoder electronics and the CCD array. Since operations occur in the spatial domain, the overall system transfer function is the product of the individual components. Expressed mathematically, $$O(f) = I(f) L(f) R(f) CCD(f) \tag{7}$$

where:

O(f) is the output signal in spatial domain for a degraded bar target;

I(f) is the input bar target spatial frequency dependent on the smallest bar code;

L(f) is the lens spatial resolution or MTF;

R(f) is the readout electronics or transfer MTF; and

CCD(f) is the CCD spatial frequency or CCD MTF.

From the geometry of the CCD array, $$MTF = \text{sinc}\left(\frac{f \pi x}{f_{max} p}\right) \tag{8}$$

where:

p=cell periodicity x=cell dimension in the x-direction $f_{max}$=1/p when p=x.

From detection theory, the output signal in spatial frequency must have a value of 0.1 for useful discrimination, i.e., O(f)=0.1. Therefore, if I(f)=0.55 (the contrast of the dark to light bars at 0.660 μm), R(f)=0.95 and CCD(f)=0.95 then L(f) must be >0.20 for all positions of the bar code object position.

The above includes all system components that can degrade the resolution of a perfect bar code. A term is added to include the magnification effect that occurs for a finite object as its distance to the first lens surface is varied. The limiting discernable image bar size is equal to its object size times the optical system magnification. For example, for a 0.006 inch (0.150 mm) object bar and a system magnification of 0.5, the image bar size is 0.075 mm. This is the same as 26.66 l/mm. Therefore, the lens must have the response L(26.66)=0.2, which can be expressed mathematically as:

$$L(2/obj \times mag) > 0.2 \tag{9}$$

where:

obj is the x-dimension of the smallest bar to be read; and mag is the magnification for the optical system.

The image of a point formed on an x,y plane can be calculated as a modulation transfer function in spatial frequency. If P(x,y) is, by definition, the point spread function, that is the distribution of points of ray intercepts at the image plane, then the line spread function is the integral of the point spread function in one direction. Therefore, $$L(x) = \int P(x,y) dy. \tag{10}$$

The modulation transfer function (MTF) which determines the spatial resolution in one direction is given by:

$$MTF(f) = [A_c^2(f) + A_s^2(f)]^{1/2} \tag{11}$$

where, $$A_c(f) = \frac{\int L(x) \cos(2\pi f x) dx}{\int L(x) dx} \tag{12}$$

$$A_s(f) = \frac{\int L(x) \sin(2\pi f x) dx}{\int L(x) dx}. \tag{13}$$

If the origin of the x,y coordinates is placed at the centroid of P(x,y), then the function $A_s(f) \to 0$. The expression for MTF can be approximated by:

$$A_c(f) = 1 - 2\pi^2 f^2 \left[\frac{\int L(x) x^2 dx}{\int L(x) dx}\right] \tag{14}$$

or $A_c(f) = 1 - 2\pi^2 f^2 B_x^2$, where $B_x^2$ is the rms blur of L(x). The relation between the point spread function P(x,y) and the rms blur of the image point is given by:

$$B = (B_x^2 + B_y^2)^{1/2}. \tag{15}$$

The range over which an imaging bar code reader can function is dependent upon four variables, which are: 1) input bar code spatial frequency, 2) resolution of the optical lens, 3) resolution of the CCD, and 4) contrast of the bar code. With the assumption that high quality bar codes will be read, the contrast can be considered to be 1.0 over all spatial frequencies. (For poor quality bar codes, the contrast can drop to a value of 0.5 over all spatial frequencies.) The CCD with an 11 micron pixel pitch and spacing has an MTF of approximately 1.0 over the spatial frequencies that correspond to commonly used bar codes. (For a CCD with an 8 micron pitch and spacing, the MTF would be slightly higher but almost the same, because bar codes are being read with a spatial frequency of less than 20 line pairs per millimeter.) The two variables left as a function of each other are the bar code spatial frequency at the image plane and the degraded resolution of the lens as a function of object position. Since we are concerned with imaging objects over finite extents, we must compute the magnification (or reduction) at the image plane over the expected object distances.

The magnification of a lens system having a focal length of f=35 mm and with a nominal 30 degree total field of view used with a 28.5 mm CCD was computed from exact ray tracing over a range of object distances corresponding to 0.5 inches to approximately 20 inches from the front surface of the scanner. The magnification is selected so that, for a given distance, the complete area of the CCD array is filled up with the bar code image. This efficient use of the detector allows the maximum possible depth of field. These magnifications are listed in Table 6. The resulting spatial frequency in lines per millimeter is given by:

$$F_s = 1/(\text{magnification})(\text{bar width}). \tag{16}$$

This, in effect, determines the minimum spatial resolution that must be decoded. For example, for a 13 mil (0.013") bar code at a distance of 4 inches from the scanner head, the optical resolution must be greater than 1/(0.38) (0.33 mm), or, 8 line pairs/mm. See FIG. 23 which shows that at 8 line pairs/mm, the contrast for a square wave (bar code) input of 0.91 meets the criteria of having a contrast greater than zero.

The resolution of the optical system for any object distance is determined from a square wave modulation transfer function calculation. This is the Fourier transform of the image spot size for a square wave input (i.e., bar target or bar code), which yields the spatial frequency of the spot size in lines/mm. This degraded resolution (for an object not at best focus) must be greater than the minimum required resolution. For example a maximum resolution in excess of 20 lines/mm for an object distance of 4 inches is shown in FIG. 23. This would mean that all bar codes are capable of being decoded at this object distance, since the highest minimum resolution required is 17.5 lines/mm (for a 6 mil bar code). Table 6 shows that the maximum number of the highest resolution necessary to decode a bar code of 6 mil or lower density should be 17.5 line pairs at 4 inches. FIG. 23 is the imaging diffraction square wave MTF at 5.5 inches from the scanning head, which shows the spatial resolution for all frequencies (or bar densities) at 4 inches for a 20 line pair/mm code is 0.78, which is greater than zero and can thus be decoded at 4 inches. As another example, at 2 inches away, the maximum resolution is zero at approximately 5.5 lines/mm. Point B on Table 6 shows all bar codes can be decoded except the 6 mil bar code because it has a minimum necessary resolution of 11.3 line pairs/mm, whereas all other bar codes have a minimum necessary resolution less than 5.5.

TABLE 6

| Distance (inches) | mag. | minimum resolution required (lines/mm) | | | | |
|---|---|---|---|---|---|---|
| | | 6 mil | 13 mil | 30 mil | 44 mil | 72 mil |
| 0.5 | 2.1 | 3.1 | 1.4 | 0.6 | 0.5 | 0.3 |
| 1.0 | 1.1 | 6.0 | 2.7 | 1.2 | 1.0 | 0.5 |
| 1.8(B) | .59 | 11.5 | 5.1 | 2.2 | 1.9 | 0.9 |
| 2.4 | .51 | 13.1 | 5.9 | 2.6 | 2.2 | 1.1 |
| 3.4 | .42 | 15.9 | 7.2 | 3.1 | 2.7 | 1.3 |
| 4.0(A) | .38 | 17.5 | 8.0 | 3.4 | 2.9 | 1.4 |
| 4.4 | .36 | 18.5 | 8.4 | 3.6 | 3.1 | 1.5 |
| 5.4 (nominal) | .31 | 21.5 | 9.8 | 4.2 | 3.6 | 1.8 |
| 6.4 | .28 | 23.8 | 10.8 | 4.7 | 4.0 | 2.0 |
| 7.4 | .25 | 26.7 | 12.1 | 5.3 | 4.5 | 2.2 |
| 8.4 | .23 | 29.0 | 13.2 | 5.7 | 4.8 | 2.4 |
| 9.4 | .21 | 31.7 | 14.4 | 6.3 | 5.3 | 2.6 |
| 10.4 | .19 | 35.0 | 15.9 | 6.9 | 5.9 | 2.8 |
| 11.4 | .18 | 37.0 | 16.8 | 7.3 | 6.2 | 3.0 |
| 12.4 | .17 | 39.2 | 17.8 | 7.7 | 6.6 | 3.2 |
| 13.4 | .16 | 41.7 | 18.9 | 8.2 | 7.0 | 3.4 |

TABLE 6-continued

| Distance (inches) | mag. | minimum resolution required (lines/mm) | | | | |
|---|---|---|---|---|---|---|
| | | 6 mil | 13 mil | 30 mil | 44 mil | 72 mil |
| 14.4 | .15 | 44.4 | 20.2 | 8.8 | 7.5 | 3.6 |
| 15.4 | .14 | 47.6 | 21.6 | 9.4 | 8.0 | 3.9 |
| 16.4 | .13 | 51.3 | 23.3 | 10.1 | 8.6 | 4.4 |
| 17.4 | .125 | 53.3 | 24.2 | 10.5 | 8.9 | 4.6 |
| 18.4 | .12 | 55.5 | 25.2 | 11.0 | 9.3 | 4.6 |
| 19.4 | .115 | 58.0 | 26.4 | 11.4 | 9.7 | 4.8 |

By utilizing the information provided in Table 6 and in FIGS. 20-25, it is possible to determine the criteria for acceptable resolution of any given bar code or similar symbol at distances of up to 20 inches and field angles up to ±15° (total field of 30°). This wide field of view also allows bar codes to be read at a range of pitch and skew angles without requiring perfect alignment of the scanner with the surface on which the code is affixed.

Now looking to the electrical components of the scanner, the drive clock sequencer and synchronization module 106 utilizes a single quartz crystal or external clock to provide all necessary logic and synchronization signals. A TTL/MOS buffer 104, as is known in the art, is included as an interface between the area array 102 and the sequencer module 106.

A pixel defect corrector 108 is included in the CCD module to manage pixel defect correction. It operates by replacing the signal of the defective pixel or pixels on a line with the signal produced by the last non-defective pixel.

Electrical power is provided to the CCD array by D.C. source or battery 46. In a first embodiment of the invention, the supply of power to the CCD array is coordinated by a clocking signal with the sequential or graduated illumination of the LEDs. Specifically, as seen in FIG. 7e, a clock signal (from clock 50) is provided to the CCD array to clear it in coordination with the activation of the LEDs. The CCD array can be scanned at a variable rate, from 36 to 200 scans per second, with the rate being determined by the density of the bar codes being scanned and the optical signal-to-noise ratio. The scan rate is set by the system clock which then modifies the illumination sequence of the LEDs so that the coordination illustrated in FIGS. 7a-7e will be maintained. The determination of scan rate can be pre-programmed and can be initiated by scanning a bar code with the scanning rate set-up information, or other relevant information, prior to measurement of the bar codes of interest.

Figure 8:
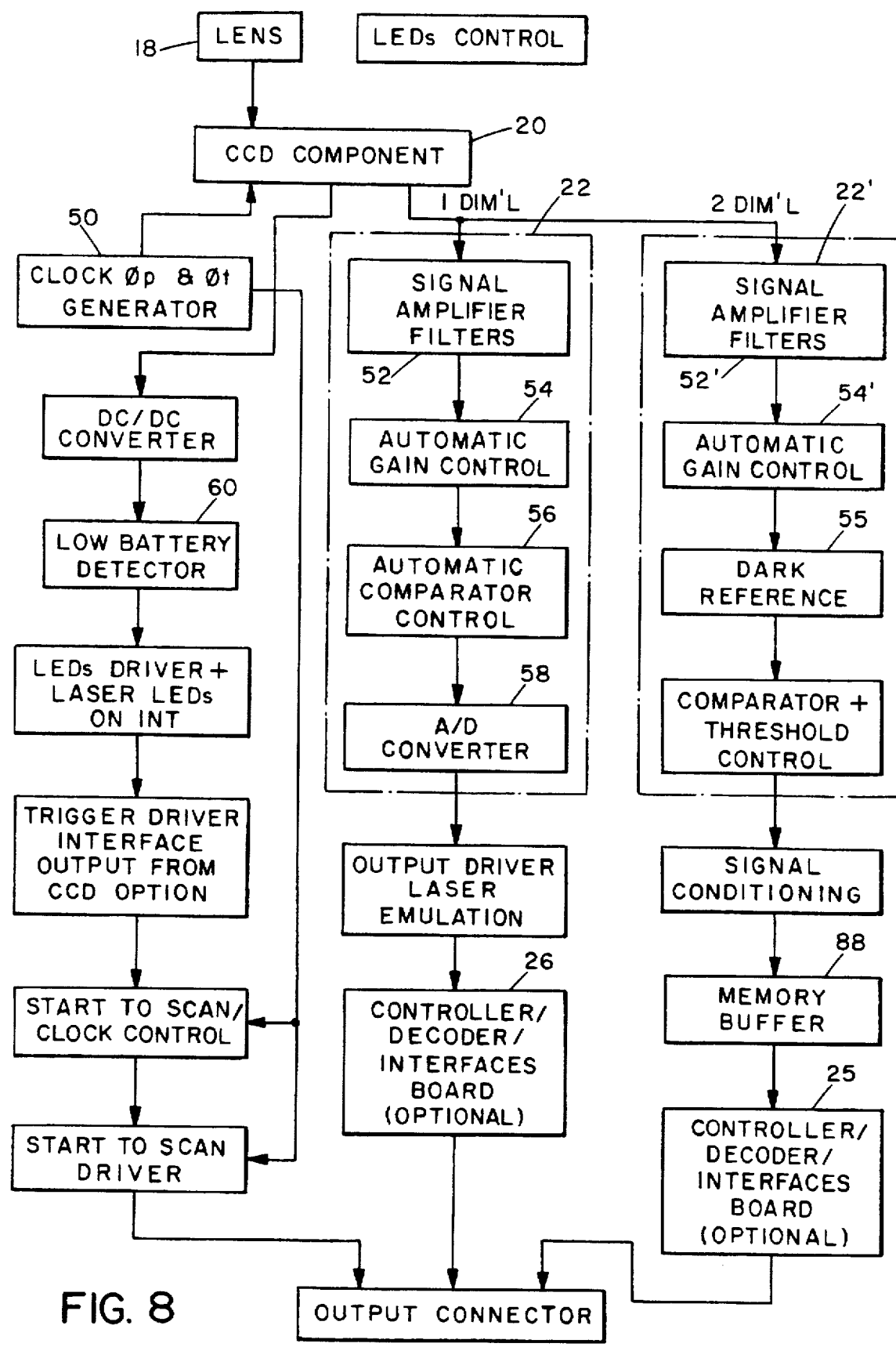
FIG. 8 is a block diagram of the operational sequence of the optical scanning head according to the present invention.

The processing sequences are shown in FIGS. 8 and 12. The signal provided by the CCD array will be amplified then processed through a low pass two pole filter and a high pass (25 KHz-30 KHz) five pole filter (shown combined as filter 52) which will extract from the useful signal any noise generated either by the incoming light or by the CCD array itself. An optional automatic gain control (AGC) 54 will adjust the level of the signal to a pre-determined level. The level of the signal entering the AGC is a function of the distance at which the bar code is scanned. The greater the distance that the scanner is held above the scanned code, the weaker the signal will be. A filtered signal will then provide a voltage to a circuit which determines the real time center point ("zero crossing") reference level to a comparator with a gain of 500,000 which will convert the analog video output signal to a digital signal representing the bar code. The use of an automatic comparator control (ACC) 56 will avoid noise generated by hysteresis and will avoid missing the white guard and the first commutation which represents the first bar in the video signal. The signal is then converted from analog to digital by A/D converter 58 and sent to decoder 26. The reference voltages to the A/D converter are selected to maximize the full scale range of the A/D converter for the offset voltage from the CCD array. The $-V_{REF}$ for the A/D converter may be made programmable to maximize the sensitivity for low light level situations. The output of the A/D converter will be latched for reading by the microprocessor, so the output value may be read while the next conversion is in progress. The analog voltage data received from the CCD array is processed by the software executing on the microcontroller. The software provides an edge detection algorithm utilizing dynamic hysteresis based upon a histogram sampling method. The interpreted edges of light and dark are output in real-time to a TTL output pin that feeds the processed signal to the bar code detector. A video signal processing module, as is known in the art, may also be used to process the analog signal to provide a digital output data stream and/or to decode and provide a signal representing the decoded information within a two-dimensional bar code.

In an alternate embodiment, rather than sequentially illuminating the LEDs, the voltage to the LEDs is regulated in response to the signal level in the detector. The stronger the received signal, the lower the intensity of light required from the LEDs. The strength of the signal is dependent upon the distance between the scanner and the bar code, so, at the maximum scanning distance, the LEDs will receive full power. This conserves power by only demanding the power that is necessary. It also avoids saturating or distorting the detected signal if the bar code is read at a short distance from the scanner with high intensity light.

Figure 6:
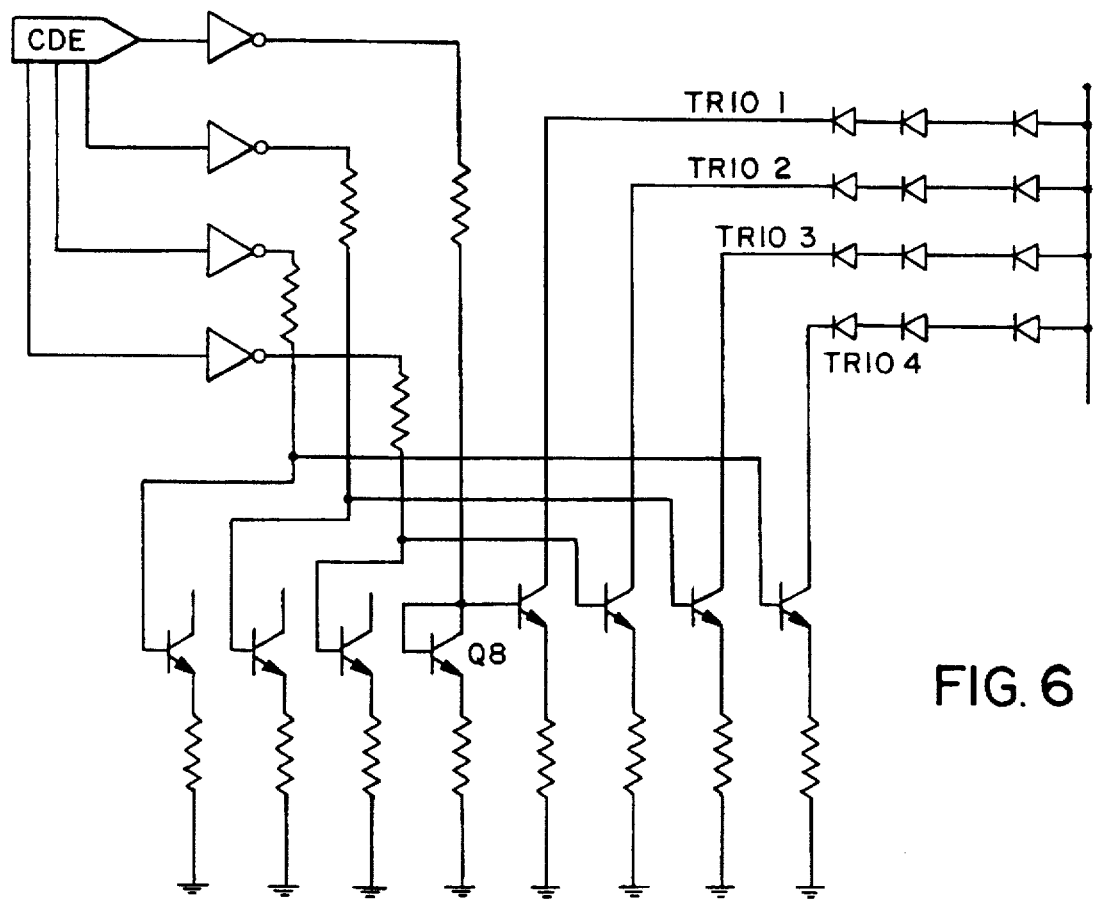
FIG. 6 is a circuit diagram of the LED board for the 12 LED configuration of FIG. 1.

The optical scanning head of the present invention provides for conservation of power supply energy by using a system clock to control a scanned, progressive illumination of the LEDs in coordination with clearing of the CCD array. The circuit diagram in FIG. 6 is provided to illustrate the sequential control of the four different LED trios which are illustrated in the embodiment of FIG. 1. For example, the clock driver provides a signal to activate amplifier U2A which then provides a signal to the first trio, identified as TRIO 1, to illuminate LEDs 6, 10 and 13. TRIO 1 is connected so that it will be on at all times that the scanner is activated, regardless of which other trios are on (note the base-collector short at transistor Q8).

Figure 7:
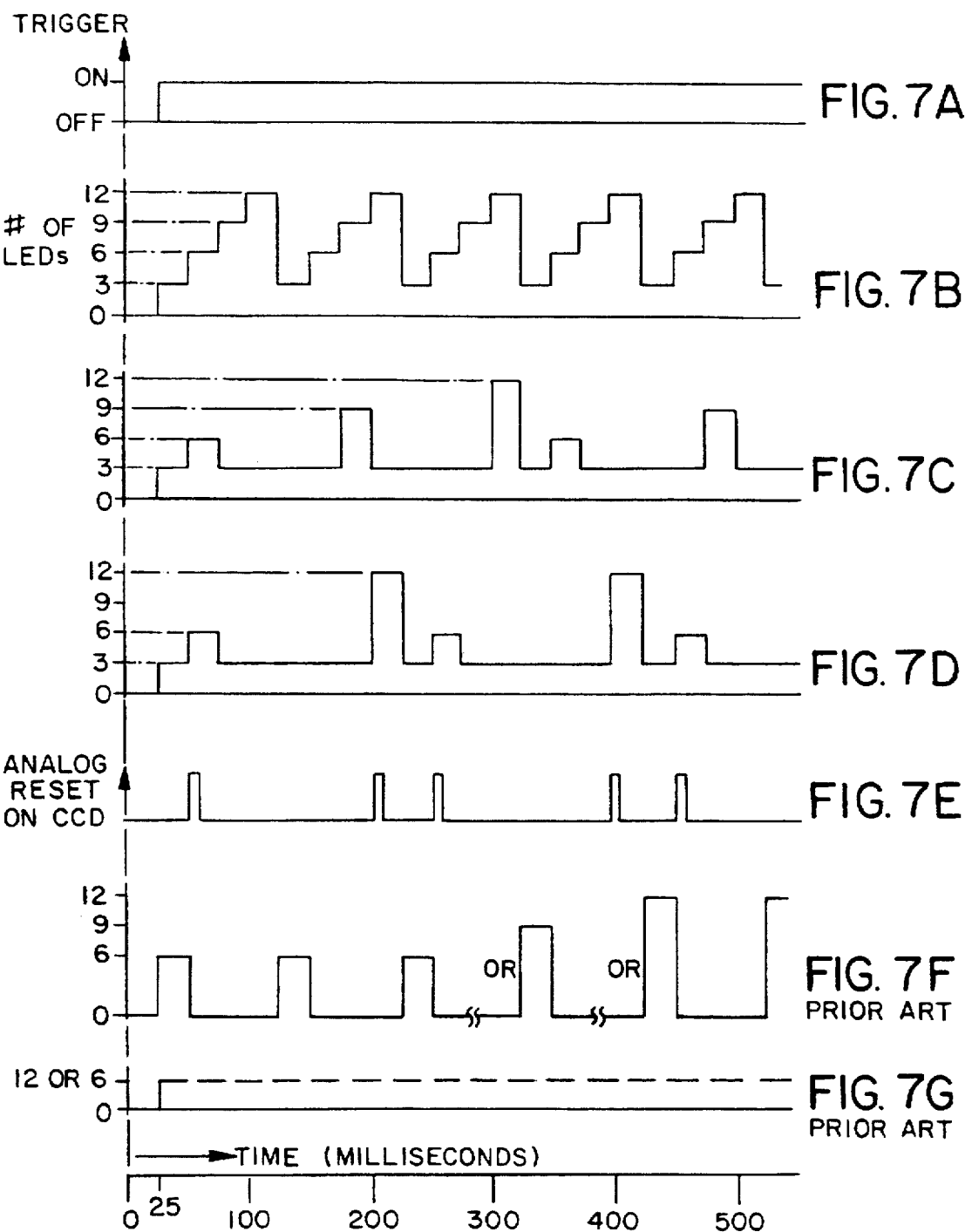
FIGS. 7a through 7g are plots of clock pulses for different timing configurations with respect to activation of the scanner (FIG. 7a); alternate illumination cycles (FIGS. 7b, 7c and 7d) according to the present invention; analog reset of the detector (FIG. 7e); and illumination patterns according to prior art methods 1 and 2 (FIGS. 7f and 7g)

FIG. 7 provides samples of pulse patterns for activation of the LEDs of the embodiment illustrated in FIG. 1. FIG. 7a illustrates the activation of the scanner at the beginning of a first clock pulse, i.e., the power is turned on. According to the pulse pattern illustrated in FIG. 7b upon application of the "turn on" signal, first trio of LEDs (TRIO 1) is illuminated. At the beginning of the second clock cycle a second trio (TRIO 2) is illuminated. Also at this time, a signal is provided to the CCD array to reset it to initiate its detection function, shown in FIG. 7e. At the beginning of the third clock cycle a third trio of LEDs (TRIO 3) turns on, and during a fourth clock cycle a fourth set of LEDs (TRIO 4) turns on. During the fifth clock cycle TRIO 2, TRIO 3 and TRIO 4 turn off and only TRIO remains on. This step up/drop down sequence is continued until the trigger is turned off at the point illustrated in FIG. 7a. In FIG. 7c a second possible pulse pattern is illustrated in which the first trio of LEDs turns on during the first clock cycle and a second LED trio turns on the second clock cycle, then turns off in the third clock cycle so that the first trio remains on until the seventh clock cycle when the second and third trios turn on for a single clock cycle. The first trio of LEDs remains on during the entire procedure and in the twelfth clock cycle, all four trios of LEDs turn on for one cycle. After a single clock cycle, where only the first set of LEDs remain on, the sequence repeats. In FIG. 7d the pulse pattern alternates between two trios of LEDs being on and turning on four trios of LEDs, with one trio being on at all times. For comparison of the inventive method to prior art practices, FIGS. 7f and 7g are provided. In FIG. 7f, a simple alternation occurs between on and off. In FIG. 7g, any combination of the LEDs remains on at all times that the trigger is activated.

Figure 9:
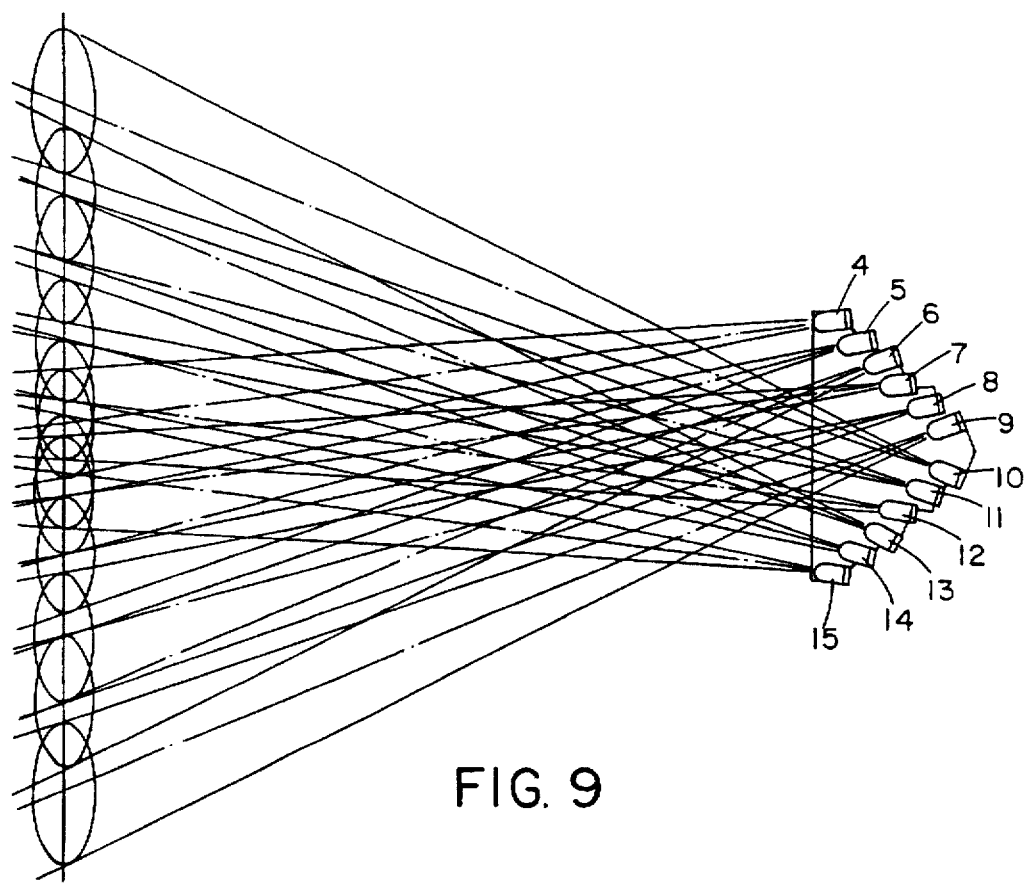
FIG. 9 is a diagrammatic view of an alternate LED layout and the corresponding light distribution.

In an alternate embodiment, power conservation is achieved by regulating the voltage supplied to the LEDs in response to the level of the signal generated by the detector array. As above, the detector signal level is dependent upon the distance at which the bar code is scanned. For greater distances, the signal level will be lower. In response to this lower signal, the voltage supplied to the LEDs will be increased. When the signal level is above a pre-determined limit, the voltage supplied to the LEDs will be less, since less light is needed to provide an acceptable signal. As an example, if the bar code is read at close range, the LEDs will be supplied with a 25% of the maximum current drain, which, in the prototype device, is 5 mA. If the bar code is read within the middle of the total field depth, the LEDs receive 50%, or 10 mA. At the outer limits of the field depth, the supplied current will be 20 mA. The percentage of power applied to the LEDs may change with the color of the bar code as needed to obtain the optimal light intensity for scanning. This power management technique will use the level of the video output signal to command and control the current on the LEDs through an appropriate clocking function The light path of the incident beam at the front region of the scanner will generate a beam of light through angular distance over a field of view across the bar code symbol located in the vicinity of the reference plane. The width of the light transmissive window 24 represents a limiting factor for the width of the incident beam. For this reason, the LEDs are mounted as close as possible to the window 24 to optimize the field of view and the incident beam power. Despite this limitation, the field of view of the incident beam is generally independent of the width of the PCB 2 or of the housing. This permits the field of view, i.e., the transverse beam dimension of the incident beam to be larger than the width of the window 24. This is due to the fact that the LEDs emit the incident beam at different directions from each side of the device within the scanning head. The LEDs are oriented to provide parallel beams in pairs. For example, a first pair of LEDs, LEDs 4 and 7 are oriented at a 7.5° angle on the y-axis(a line normal to the front of the PCB 2), 5 and 8 are oriented at 15°, and LEDs 6 and 7 are oriented at 22.5°, as illustrated in FIG. 9. The LEDs on the other leg of the "V" are similarly oriented in the opposite direction. As can be seen in the figure, the fan of light which results from this orientation provides an intensity distribution which is higher within a narrow region at the center of the fan, as determined at a distance of 7 inches from the scanner.

Figure 10:
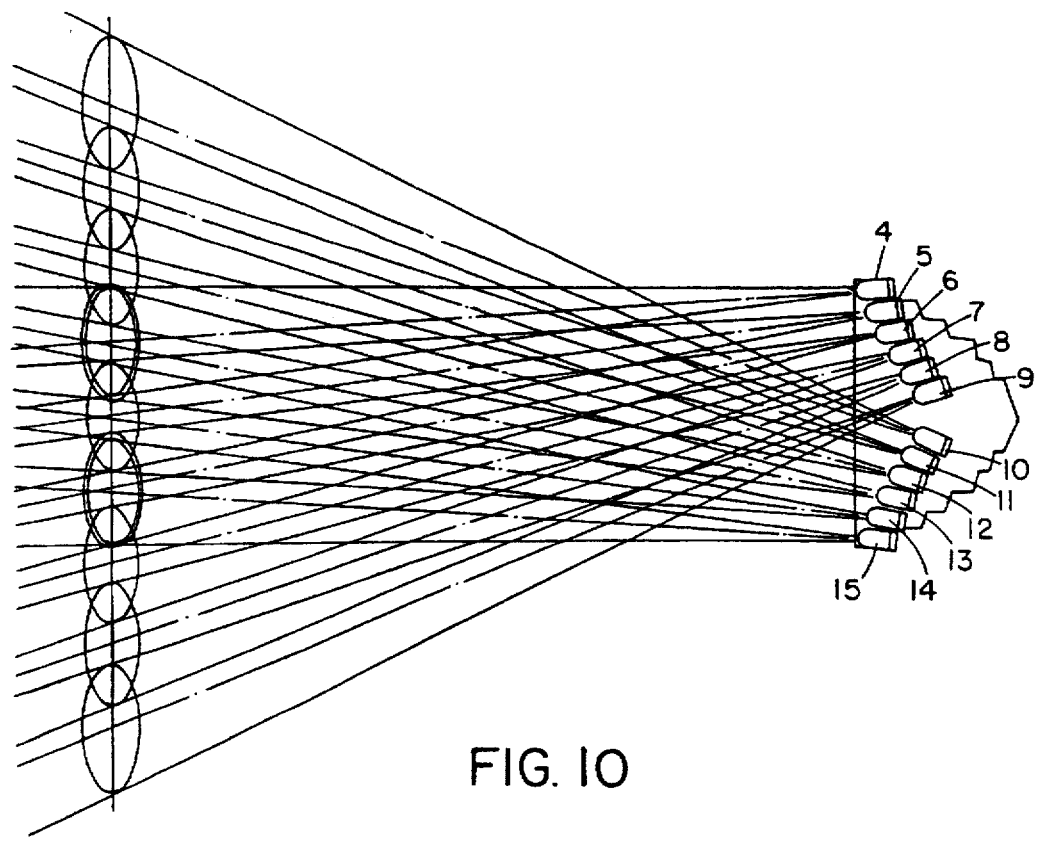
FIG. 10 is a diagrammatic view of a second alternate LED layout and its corresponding light distribution.

The alternate LED arrangement shown in FIG. 10 places the centermost LEDs at an angle of 3.75 degrees from a line normal to the front of the scanner, with the other LEDs being oriented at 3.75 degree increments as they progress outward along the legs of the "V". This LED configuration results in a slightly wider region of higher intensity as compared to the above-described embodiment. It should be noted that the cylindrical lens 38 should be positioned at a distance from the LEDs corresponding to the location where the beams cross to provide the highest intensity, e.g., location 120 in FIG. 10.

A third configuration of the LEDs is illustrated in FIG. 11, which shows a line of LEDs at varying orientations. This configuration is described above, as is the fourth configuration illustrated in FIG. 27.

Other electrical sub-circuits can also be provided on PCB 2, including the analog filter 50 and A/D converter 52. However, in order to configure the housing of the scanner in a desired position, it may be necessary to provide a second circuit board oriented at some angle to the first circuit board onto which additional subcircuits can be placed including a decoder chip and a memory device. For example, two circuit boards can be configured so that one abuts the other at approximate right angles to create an "L"-shaped arrangement. This arrangement would allow placement of one of the boards in the barrel of a scanning gun with the other board extending partially into the handle portion.

Figure 12B:
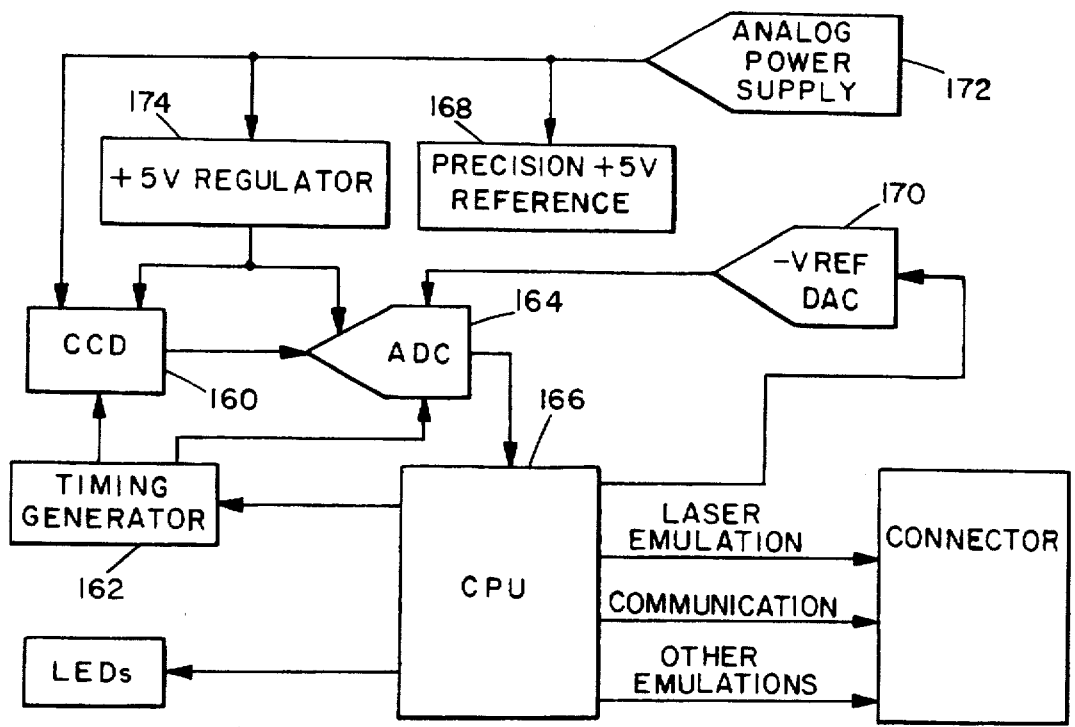

Now providing a more detailed description of an alternate embodiment, the scan sequence for which is illustrated in FIG. 12b, the optical scanning head will utilize a CCD linear image sensor array 160 for converting the bar code image into electrical impulses. In the exemplary embodiment, the image sensor is manufactured by Sony. The fixed lens assembly will focus the bar code image onto an M×N array of photo-sensitive sensors that accumulate an electric charge on those cells that are exposed to light. The brighter the illumination on a cell, the greater the charge accumulated over time. The sensor operates by transferring the accumulated charge in the sensor array to a charge-coupled device (CCD), which can be thought of as a shift register than can contain discrete analog voltage values. The contents of the CCD may be shifted out serially to the output pin of the device by clocking the CCD. As part of the clocking of the CCD, the charge in each CCD cell is transferred to an output stage. The charge in the output stage must be reset, otherwise the output stage would accumulate the charge from multiple pixels over time, in effect decreasing the resolution of the device.

A zero-programmable logic device is used to generate the clocks for the CCD and the A/D converter write pulse and A/D converter data latch clock. The zero-power GAL (generic logic array timing generator) 162 enters a near zero-power standby mode when the inputs of the device stop toggling. The CCD linear sensor array and the A/D converter 164 are operated in lock-step synchronization for optimum signal-to-noise characteristics.

Each pixel is comprised of two data samples. The first sample is the precharge voltage of the previous pixel in the CCD as it was being reset. This sample is made available when the external reset mode of the CCD is used, and the internal sample and hold in the CCD linear sensor is disabled. This is a sample of the low frequency noise level. The second sample is the actual pixel charge value. By subtracting the pixel charge value from the previous pixel precharge value, the low frequency noise can be effectively eliminated from the pixel signal.

Due to the limited number of product terms in the GAL 162, the state machine implemented in this GAL clocks the extraneous CCD precharge value into the output data latch immediately after the READ GATE is fired. Thereafter, the first data value that becomes available is discarded. The next subsequent data value is the real precharge value, which will then be followed by the first dummy pixel from the CCD.

The timing generator 162 supports a special mode to rapidly dump and reset the contents of the CCD. When the CCDDUMP-signal is asserted, the CCD clock becomes a "divide by 2" of the input clock (446,836 Hz). It is assumed that the CCDDUMP-signal is also connected to the CCD EXSW input, so that when the CCDDUMP-value is a zero, EXSW is zero, putting the CCD into internal reset mode. In this was, the entire contents of the CCD may be reset in approximately 4.7 ms, compared to 37.347 ms for a normal read. Even faster reset times may be achieved by programming the timing generator clock output to be a higher frequency during the reset period.

Using this feature will allow the simulation of an electronic shutter with an adjustable exposure time between 4.7 ms (1/213 of a second) and 60 ms (1/16 of a second). Even longer exposure times may be programmed by delaying the read gate between scans. When in the CCDDUMP mode, no A/D conversions take place, and no data is latched.

The timing parameters for the Sony linear sensor arrays ILX-503/703 and the ILX-505 that were used in the exemplary embodiment are provided in Table 7.

TABLE 7

| | |
|---|---|
| CPU External Crystal Frequency | 19.6608 MHz |
| CPU Internal Clock Frequency | 9.8304 MHz |
| Timing Generator Clock Divisor | 11 |
| Timing Generator Clock | 893.67 Khz |
| CCD Clock Divisor (read) | 16 |
| CCD Clock Frequency (read) | 55.854 Khz |
| CCD Clock Divisor (dump) | 2 |
| CCD Clock Frequency (dump) | 446.84 KHZ |
| ILX-503/703 Total CCD Cells | 2086 |
| Time required to read ILX-503/703 | 37.347 ms |
| Maximum scans/second (503/703) | 26 |
| Time required to dump ILX-503 | 4.668 ms |
| ILX-505 Total CCD cells | 2630 |
| Time required to read ILX-505 | 47.087 ms |
| Maximum scans/second (ILX-505) | 21 |
| Time required to dump ILX-505 | 5.885 ms |

The outputs of the timing generator are buffered to CMOS levels by an external 74HC368 Hex Driver. This tri-state device provides the necessary clocking drive that the CCD linear sensor array device requires. The analog SHUTDOWN signal will tri-state the outputs of the hex driver, further minimizing power consumption.

The microcontroller 166 controls the power to two LEDs connected in series for illumination of the bar code. In addition, the microcontroller 166 will be capable of controlling the power to the CCD sensor array 160 and analog circuitry. The microcontroller 166 may optionally control the power on an external interface board so that external interfaces may be shutdown when not required. For example, the microcontroller 166 is normally in a REST mode, where all system clocking has been stopped. The microcontroller 166 will then power up and immediately enter the bar code acquisition mode when the illumination enable input is asserted.

An 8-bit A/D converter 164 is used to convert the pulsed analog pixel and precharge voltages that are output by the linear sensor array. The multiple-sources AD0820A high-speed 8-bit A/D converter using a modified "flash" technique is operated in a stand-alone synchronous conversion mode, where the built-in track-and-hold amplifier is used to sample discrete pulses of analog voltage from the CCD linear sensor array. The track-and-hold amplifier will only sample during periods of time that the output of the CCD is stable, with a wide margin stable signal prior to and after sampling. In this way, all digital switching noise generated by the CCD will be completely eliminated from the sampled pixel and precharge output voltages.

The $V_{REF+}$ positive voltage reference input will be connected to the REF02 +5V positive voltage reference 168. The $V_{REF-}$ negative voltage reference input will be adjustable under program control to maximize the sensitivity of the A/D converter 164. The $V_{REF-}$ Adjust reference 170 is implemented using a low cost D/A converter, specifically, a multiple-sourced AD7524 8-bit multiplying D/A converter. The AD7524 will be operated in a voltage mode by using the REF input as the output to an operational amplifier configured as a voltage follower with a gain of 2. The $I_{OUT}$ output is connected to a low impedance 2.5V voltage reference and acts as an input. This configuration allows the D/A converter to be operated from a single supply and produce a full-range output voltage swing, from 0 to the input reference voltage. Additional benefits are gained including low noise, low power, low cost, and low glitch.

The linear sensor arrays require two power supply voltages to operate. A 9V analog supply 172 is required plus a 5V timing and control power supply. The power supplies to the sensor arrays must be sequenced to prevent permanent latch-up. The 9V supply 172 must rise before the 5V supply, and the 5V supply must fall before the 9V supply. If the 9V supply is ever greater than 500 mV less than the 5V supply, permanent latch-up may occur. There is also concern about the signal degradation that may be incurred by utilizing a single +5V supply for both the analog and digital sections of the optical scanning head. High frequency digital noise injected into the power and ground planes may exceed the analog signal level, severely impacting the maximum resolution of the scanner.

To mitigate these potential problems, three separate power supplies are derived from the input +5V to the optical scanning head. The +9V supply is generated from the +5V input supply using a Linear Technology LT1111 Micropower DC-to-DC converter. The internal spar Op-Amp in the LT1111 is used as a post-regulator to minimize output ripple. A passive LC filter is also employed to reduce output ripple to a maximum of 2 mV. A TTL-compatible shutdown input is provided to the +9V supply through the use of a p-channel MOSFET high-side driver. When the shutdown input is driven above 4.5V, power to the LT111 is cut off, thereby shutting down the +9V supply. Quiescent current is limited to the leakage current from the Gate input of the MOSFET to the Drain output—approximately 100 nA.

The 9V supply provides a maximum of 140 mA of power. The +9V supply powers the sensor array, the $V_{OUT}$ transistor, a +5V band-gap reference voltage generator, and a +5V linear regulator 174.

The +5V reference voltage is generated by the industry standard REF02 band-gap voltage reference 168. The +5V voltage reference 168 is used for the $V_{REF+}$ voltage reference to the A/D converter 164, and as the voltage reference to the D/A converter 170. The +5V reference voltage is passed through a voltage divider network to derive a 2.5V reference input to an Op-Amp configured as a unity-gain follower. The output of the Op-Amp drives the D/A converter $I_{OUT}$, configuring the D/A converter 170 as a voltage output D/A converter. The Op-Amp $V_{CC}$ supply input is connected to the +5V reference supply, to minimize power-supply induced errors in the output.

An analog +5V supply is derived from the +9V supply with a Linear Technology LT1121-5 Micropower Low Dropout Regulator. The analog +5V supply is reverse-polarity shunted to the +9V analog supply by a low forward voltage Schottky barrier diode. The IN5817 diode has a forward voltage drop of 320 mV, well below the maximum 500 mV differential voltage that may cause the sensor array to permanently latch-up. The analog +5V supply powers the linear sensor array, the A/D converter, and the D/A converter.

The power supply grounds are split into 3 different ground nets. The digital ground plane is connected directly to the input ground pins on the optical scanning head connector. The +9V ground has a single-point connection to the input ground pins on the optical scanning head connector. The analog +5V ground has a single-point connection to the ground pin of the LT1121-5, which joins it to the +9V ground net. The separate routing and single-point ground net tie points are critical to minimizing coupling of digital ground noise throughout the analog section.

The decoder module 26 may be either inside or outside of the scanning head housing and will process the digitalized signal generated in the scanning head to calculate the desired data, e.g., the multiple digit representation or code represented by the bar code symbol in accordance with the algorithm contained in the software program. The decoder module includes a random access memory (RAM) for temporary data storage, and EPROM or PAL for holding the control program and a microprocessor which controls the RAM and EPROM or PAL. The decoder module will also include circuitry for controlling the scanning head and the communication circuitry for communication with different functions of the scanning head or with a host system to which the scanning head can be connected, such as a hand held terminal data screen personal computer for computer network.

A low battery detector 60 is included in the housing to provide an indication of insufficient power for further scans. This will provide advance warning so that the user will be aware of the problem before having scanned a number of items without realizing that the items cannot register properly due to the insufficient power.

An electronic shutter 116, shown in FIG. 16, is activated by the clock signal from clock 50 to periodically block the light impinging upon the detector 20. This creates "snapshots" of the bar code image to preserve the integrity of the bar code pattern signal as one of the scanning head and the bar code is in motion with respect to the other.

Figure 5:
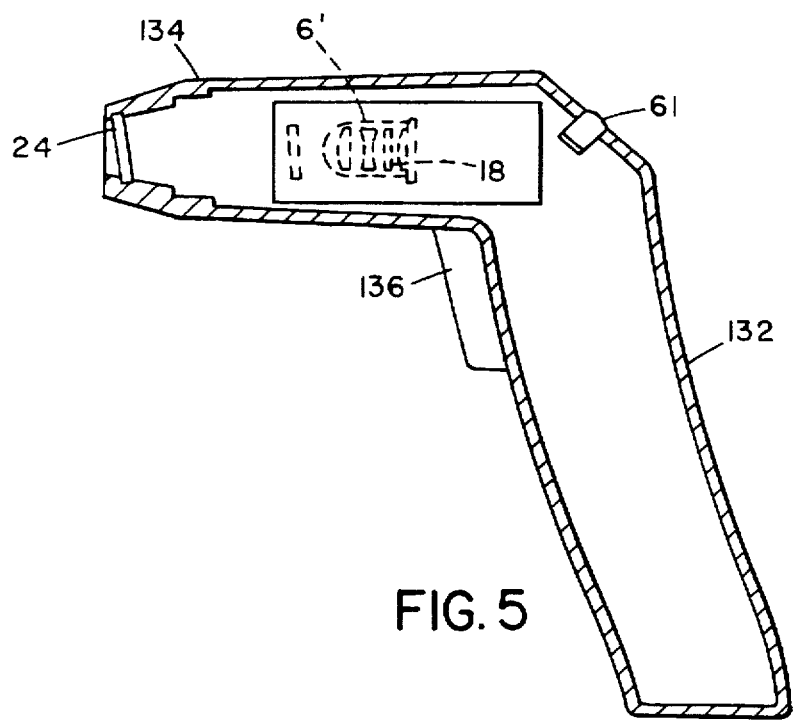
FIG. 5 is a cross-sectional view along line 5—5 of FIG. 4.

The circuitry, with or without the power supply of a portable configuration, of the optical scanner is protected within a housing 30 which is contoured to easily fit into the user's hand. The user will grip the housing 30 by its handle portion 32, illustrated in FIGS. 4 and 5, with the window portion 34 aimed at the bar code symbol to be read. The trigger 36 is built within the handle 32 for easy, one-handed operation of the scanner, with the trigger being positioned at a short distance from the user's fingers so that activation is simply a matter of depressing the trigger. A dual trigger, multi-position trigger or additional switch, is provided for selecting between one-dimensional and two-dimensional scanning, so that only as much power is used as is necessary to assure a high quality signal. The window portion can be placed anywhere from 0 to 22 inches above or in front of the bar code to be scanned. With a scanning distance of less than seven inches, it is desirable to center the fan of light over the bar code since different intensities due to the sequential limitation of the LEDs may illuminate some portions of the bar code more brightly than others, and due to the higher density of light at the center of the fan. For scans greater than 22 inches, the LEDs can be replaced with a flash lamp.

The optical scanning head of the present invention provides a device for building a small or self-contained portable device, a portable component of a multi-component scanner, or the optical portion of a built-in scanning unit, for bar code scanning which uses LED and CCD technology making it an economical device. The scanning head is capable of reading bar codes up to 22 inches away from the detector with LED illumination and even more with a flash lamp, so that it is versatile for either portable or fixed implementation. The variably pulsed activation of the LEDs and CCD array, or the graduated illumination of the LEDs, makes the device capable of operating at low power with minimal power drain during illumination, a significant factor in portable scanners. The lens system and fan of incoherent light produced by the LED array permit the reading of wide range of bar code densities and widths. For point-of-sale use, or industrial applications, where the scanner is fixed and the object imprinted with the bar code is moved past it, a number of optical scanning heads of the present invention can be used in combination and mounted at different angles so that, regardless of the orientation or position of the bar code, the bar code can be read. For example, a crossed or starburst pattern can be made by combining two or four scanning heads, respectively. The signal generated by each individual scanning head will be compared with signals from the other scanning heads, and the signal with the least error will be used. The signals from each scanning head may also be used to double check the signals provided by other scanning heads.

It is important to note that in this invention, an optimization of useful illumination from the LEDs is accomplished by a combination of focusing and diffusing the light to shape the beam to cover the field of view of the lens system. In the case of one-dimensional bar codes, it is a uniform linewidth of an extent which matches or overlaps the length of the bar code. In the case of two- or three-dimensional codes, it is a uniform circle or rectangle circumscribing the extent of the code in height and width.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. An optical assembly within an optical scanner for scanning a symbol comprising a plurality of contrasting regions representative of encoded information, each contrasting region having a bar width, wherein said symbol is illuminated by incident light to produce modulated reflected light providing a square wave input representative of said plurality of contrasting regions, said optical assembly comprising:

at least two LEDs for generating the incident light;

a detector array for detecting the square wave input and generating an electrical signal representative of the square wave input, said detector array comprising a plurality of CCDs and having an array area;

a fixed focus multi-element lens system having a pre-selected magnification for receiving the modulated reflected light and providing focused reflected light to said detector array, the pre-selected magnification being selected so that the focused reflected light impinges upon a substantial portion of said array area over a range of distances to said symbol;

wherein said at least two LEDs, said detector array, and elements of said multi-element lens system are selected by determining a spatial frequency of said plurality of contrasting regions, calculating a square wave modulation transfer function using the Fourier transform of the square wave input to determine an initial optical resolution, comparing the initial optical resolution to a minimum required optical resolution for a given density of the plurality of contrasting regions to determine whether a particular symbol with the given density can be read at a given distance from the symbol, and varying the elements of said multi-element lens system to provide an adjusted magnification and an adjusted optical resolution greater than the minimum required optical resolution at the given distance and to obtain equal resolvability for an entire field of view.

2. An optical assembly within an optical scanner as in claim 1 wherein each CCD within said detector array is assumed to have a modulation transfer function which is approximately 1.0 over a standard range of spatial frequencies for said plurality of contrasting regions.

3. An optical assembly within an optical scanner as in claim 1 wherein the minimum required optical resolution is determined according to the relationship:

$F_s = 1/(\text{magnification})(\text{bar width})$.

4. An optical assembly within an optical scanner as in claim 1 wherein a combination of said CCDs and said at least two LEDs is selected according to the relationship:

$V_{out} = \int V(\lambda) F(\lambda) d(\lambda)$, where $V(\lambda)$ is the CCD spectral sensitivity in volts/lumen/micron and $F(\lambda)$ is the flux output in lumens/micron of each LED of said at least two LEDs so that an output voltage $V_{out}$ of the CCDs is maximized.

5. An optical assembly within an optical scanner as in claim 1 wherein said multi-element lens system includes an optical bandpass filter.

6. An optical assembly within an optical scanner as in claim 1 wherein the range of distances to said symbol is 0.5 inches to 20 inches.

7. An optical assembly within an optical scanner as in claim 6 wherein the range of distances covers a field of view of up to 30°.

8. An optical assembly within an optical scanner as in claim 1 wherein said multi-element lens system is disposed at a fixed distance from said detector array.

9. An optical assembly within an optical scanner as in claim 1 wherein the magnification of said multi-element lens systems is optimized using ray tracing.

10. An optical assembly within an optical scanner as in claim 1 wherein said at least two LEDs produce sufficient illumination to obtain an output signal greater than the dark voltage noise from said detector array over the entire said range of distances.

11. A CCD optical scanner for scanning a symbol comprising a plurality of contrasting regions representative of encoded information, each contrasting region having a bar width, wherein the symbol is illuminated by incident light from at least two LEDs to produce modulated reflected light providing a square wave input representative of the plurality of contrasting regions, the square wave input being detected by a detector array comprising at plurality of CCDs and having an array area, the improvement comprising:

a multi-element lens system having a fixed focus with a pre-selected magnification for receiving the modulated reflected light and providing focused reflected light to the detector array, the pre-selected magnification being selected so that the focused reflected light impinges upon a substantial portion of the array area over a range of distances to the symbol;

wherein elements of said multi-element lens system are selected in combination with the at least two LEDs and the detector array by determining a spatial frequency of the plurality of contrasting regions, calculating a square wave modulation transfer function using the Fourier transform of the square wave input to determine an initial optical resolution, comparing the initial optical resolution to a minimum required optical resolution for a given density of said plurality of contrasting regions to determine whether a particular symbol with the given density can be read at a given distance from said symbol, and varying the elements of said multi-element lens system to provide an adjusted magnification and an adjusted optical resolution greater than the minimum required optical resolution at the given distance and to obtain equal resolvability for an entire field of view.

12. A CCD optical scanner as in claim 11 further comprising the improvement that each CCD within the detector array is assumed to have a modulation transfer function which is approximately 1.0 over a standard range of spatial frequencies for said plurality of contrasting regions.

13. A CCD optical scanner as in claim 11 wherein the minimum required optical resolution is determined according to the relationship:

$$F_s = 1/(\text{magnification})(\text{bar width}).$$

14. A CCD optical scanner as in claim 11 further comprising the improvement that a combination of the CCDs and said at least two LEDs is selected according to the relationship:

$$V_{out} = \int V(\lambda) F(\lambda) d(\lambda),$$

where $V(\lambda)$ is the CCD spectral sensitivity in volts/lumen/micron and $F(\lambda)$ is the flux output in lumens/micron of each LED of the at least two LEDs so that an output voltage $V_{out}$ of the CCDs is maximized.

15. A CCD optical scanner as in claim 11 wherein said multi-element lens system includes an optical bandpass filter.

16. A CCD optical scanner as in claim 11 wherein the range of distances to said symbol is 0.5 inches to 20 inches.

17. A CCD optical scanner as in claim 10 wherein the range of distances covers a field of view of up to 30°.

18. A CCD optical scanner as in claim 11 wherein said multi-element lens system is disposed at a fixed distance from the detector array.

19. A CCD optical scanner as in claim 11 wherein the magnification of said multi-element lens systems is optimized using ray tracing.

20. A CCD optical scanner as in claim 11 wherein the at least two LEDs produce sufficient illumination to obtain an output signal greater than the dark voltage noise from the detector array over the entire said range of distances.

* * * * *